US012745356B2

(12) United States Patent
Lee et al.

(10) Patent No.: US 12,745,356 B2
(45) Date of Patent: Sep. 22, 2026

(54) DISPLAY DEVICE WITH INNER PLATE AND FRAME

(71) Applicant: LG ELECTRONICS INC., Seoul (KR)

(72) Inventors: Jaehun Lee, Seoul (KR); Chulki Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 94 days.

(21) Appl. No.: 18/870,751

(22) PCT Filed: Jun. 3, 2022

(86) PCT No.: PCT/KR2022/007896
§ 371 (c)(1),
(2) Date: Dec. 2, 2024

(87) PCT Pub. No.: WO2023/234443
PCT Pub. Date: Dec. 7, 2023

(65) Prior Publication Data

US 2025/0374449 A1 Dec. 4, 2025

(51) Int. Cl.
*H05K 5/02* (2006.01)
*H10K 59/80* (2023.01)
*H10K 102/00* (2023.01)

(52) U.S. Cl.
CPC ........... *H05K 5/0217* (2013.01); *H10K 59/80* (2023.02); *H10K 2102/311* (2023.02)

(58) Field of Classification Search
CPC ........ G06F 1/16; G06F 1/1601; G06F 1/1612; G06F 1/1607; G06F 1/1675; G06F 1/1681; G06F 1/182; H05K 5/0217; H05K 5/03; H05K 5/0226; H05K 5/0234; G09F 9/30; G09F 9/301; H10K 59/80; H10K 59/87; H10K 77/111; H10K 2102/311
See application file for complete search history.

(56) References Cited

U.S. PATENT DOCUMENTS 5,887,959 A * 3/1999 Yuri ..................... H04N 9/3147 348/E5.131
10,656,449 B2 * 5/2020 Kim .................. G02F 1/133308
10,917,985 B1 * 2/2021 Lee ......................... G09F 9/301
2013/0114018 A1 * 5/2013 Kim .................. G02F 1/133308 349/58

(Continued)

FOREIGN PATENT DOCUMENTS

CN 111326077 A 6/2020
KR 10-2014-0026197 A 3/2014

(Continued)

*Primary Examiner* — Abhishek M Rathod
(74) *Attorney, Agent, or Firm* — Birch, Stewart, Kolasch & Birch, LLP

(57) ABSTRACT

A display device is disclosed. The display device may include: a flexible display panel; a flexible inner plate positioned behind the display panel and to which the display panel is coupled; and a frame covering an edge of the inner plate, wherein the frame may include a first frame extending along a first side of the inner plate, the first frame being fixed to the inner plate such that the first frame is bent or flat along with the inner plate, and wherein the first frame may be elastically deformed when the inner plate is bent.

14 Claims, 29 Drawing Sheets

(56) References Cited

U.S. PATENT DOCUMENTS

| | | | | |
|---|---|---|---|---|
| 2015/0181656 | A1* | 6/2015 | Bang | G02F 1/133308 313/512 |
| 2015/0373857 | A1* | 12/2015 | Chikazawa | H04N 5/455 361/679.01 |
| 2016/0353593 | A1* | 12/2016 | Park | H05K 5/0234 |
| 2017/0010499 | A1* | 1/2017 | Kang | G02F 1/133308 |
| 2017/0156220 | A1* | 6/2017 | Heo | H05K 1/028 |
| 2019/0064577 | A1* | 2/2019 | Kim | G02F 1/133603 |
| 2019/0150300 | A1* | 5/2019 | Kim | G06F 1/1652 361/807 |

FOREIGN PATENT DOCUMENTS

| | | | |
|---|---|---|---|
| KR | 10-2183884 | B1 | 11/2020 |
| KR | 10-2208080 | B1 | 1/2021 |
| KR | 10-2392435 | B1 | 4/2022 |

* cited by examiner

[FIG. 2]
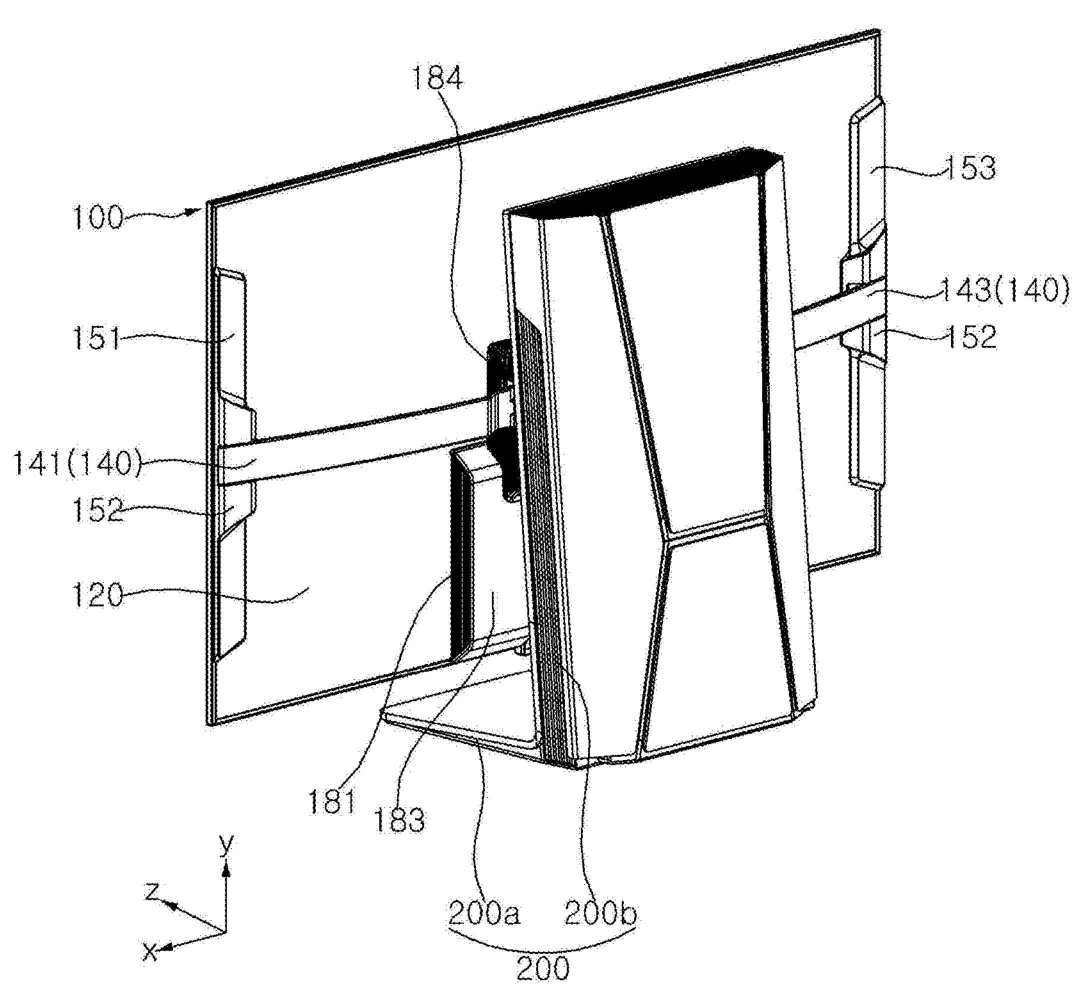

[FIG. 3]
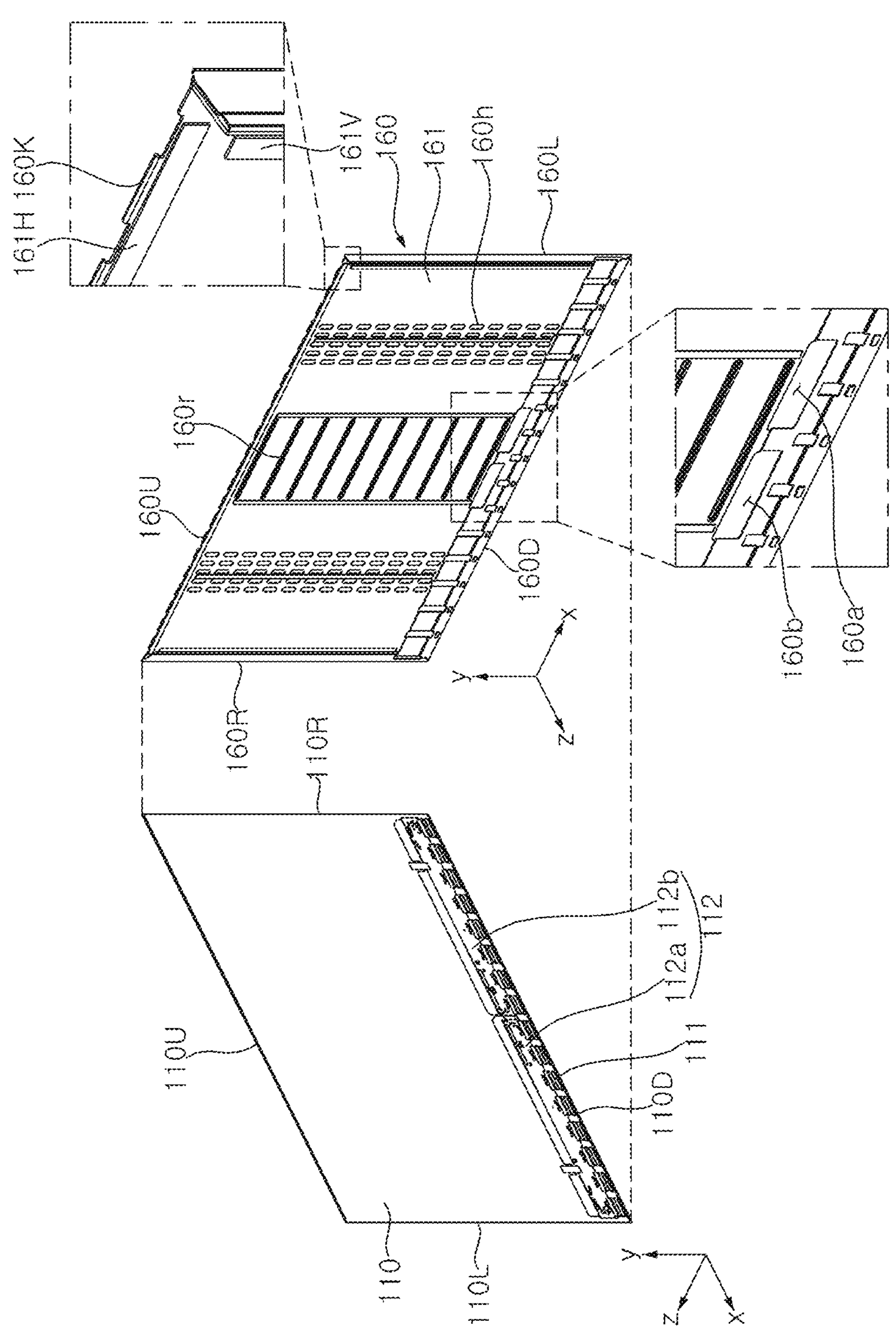

[FIG. 4]
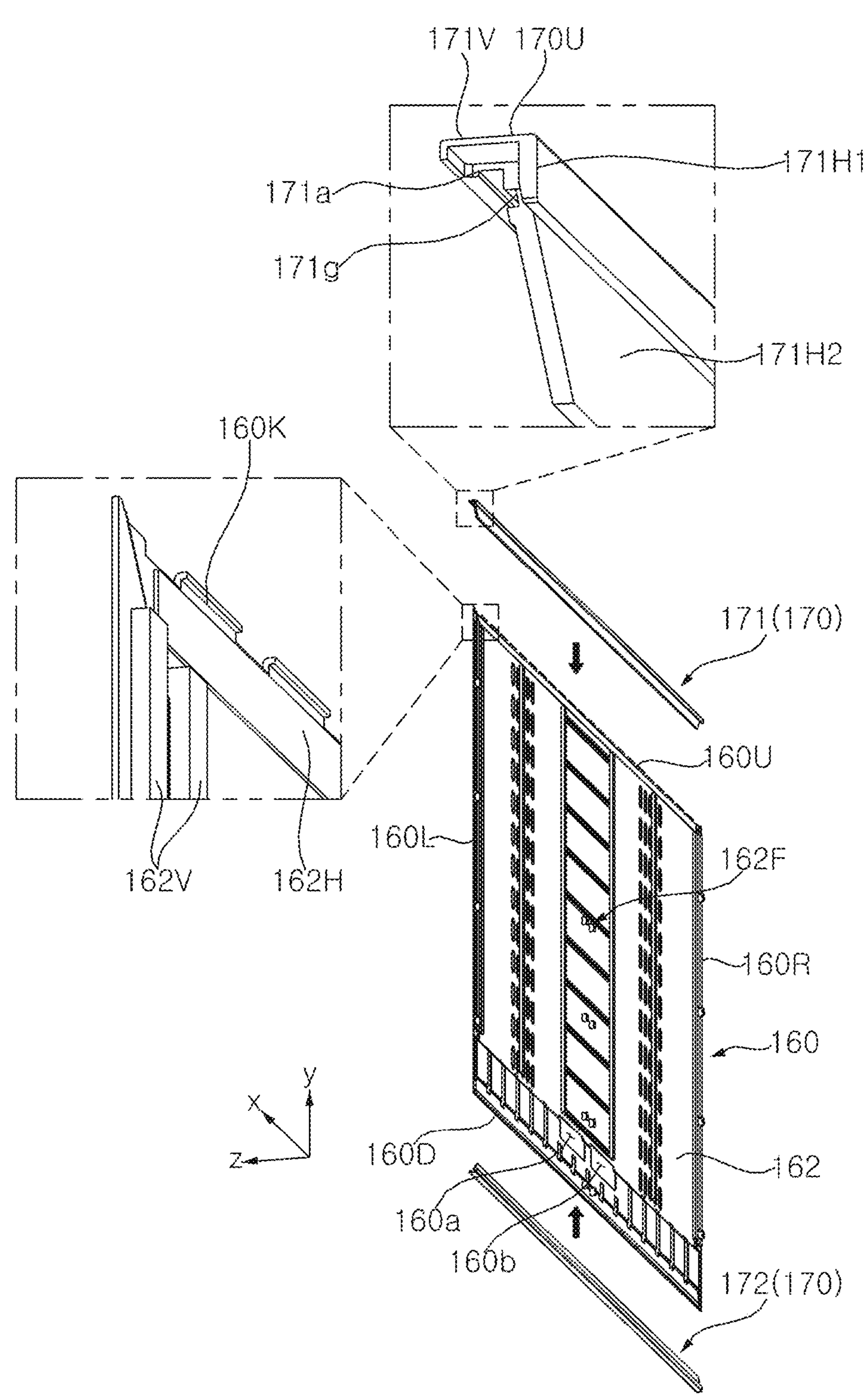

[FIG. 5]
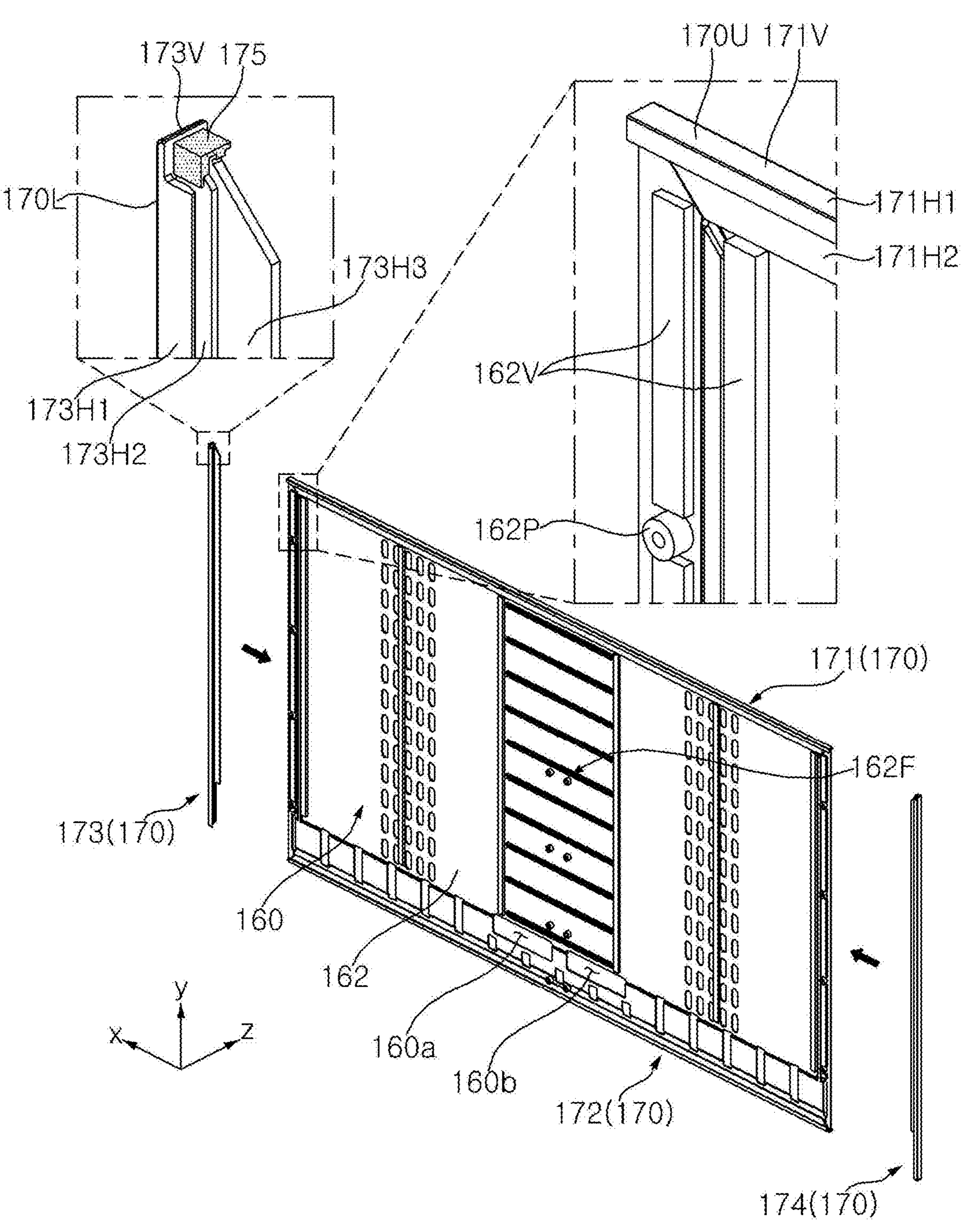

[FIG. 6]
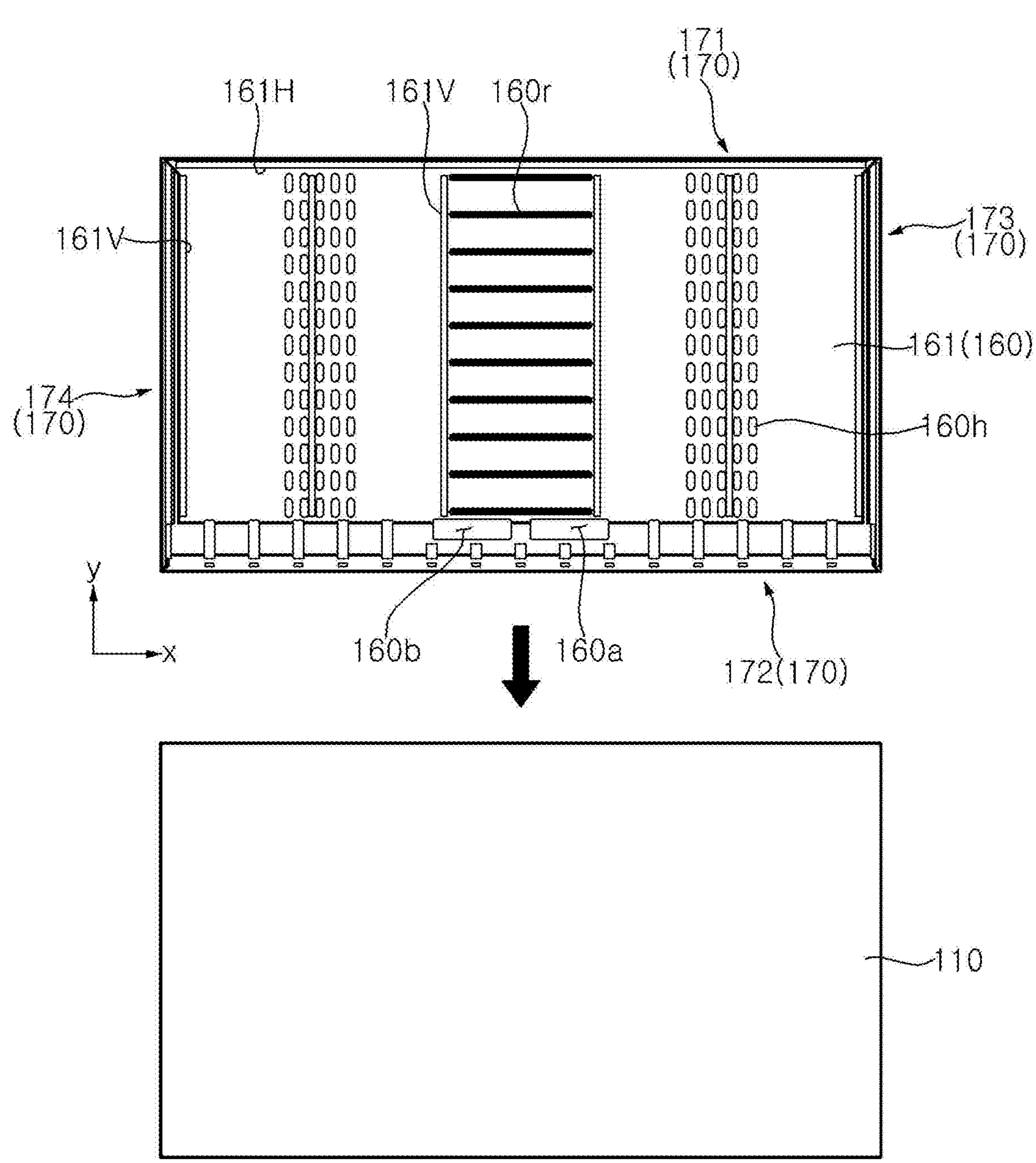

[FIG. 7]
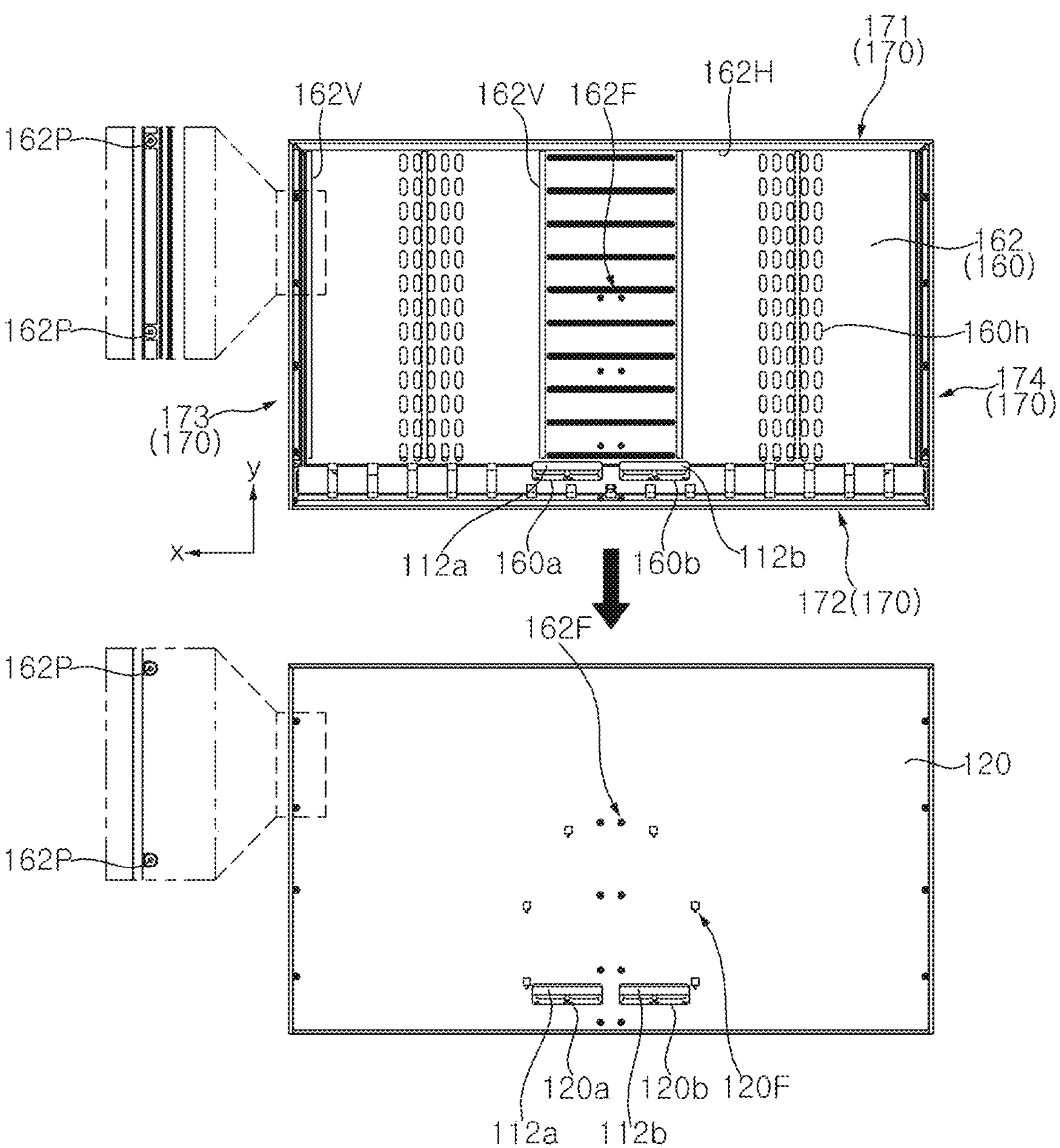

[FIG. 8]
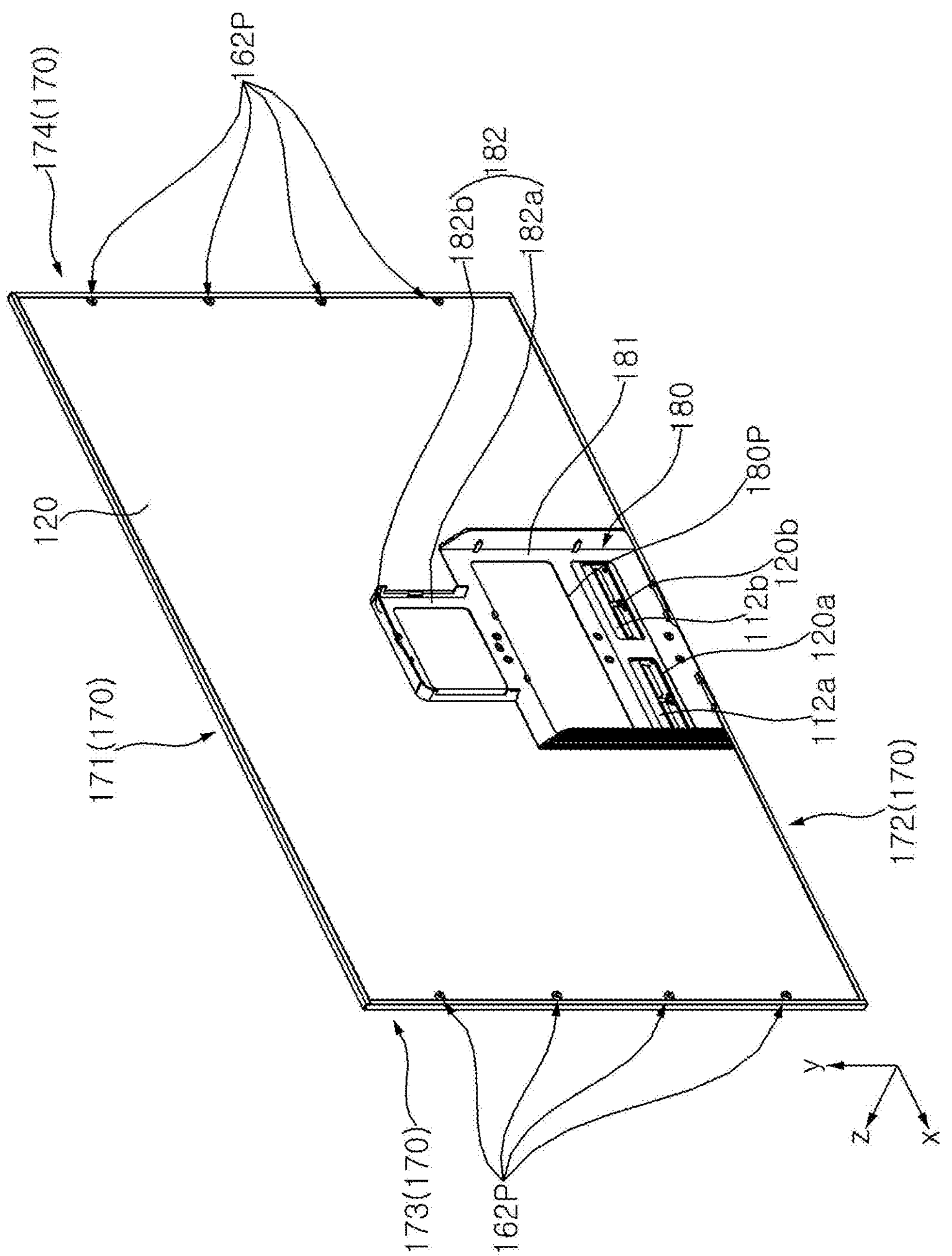

[FIG. 9]
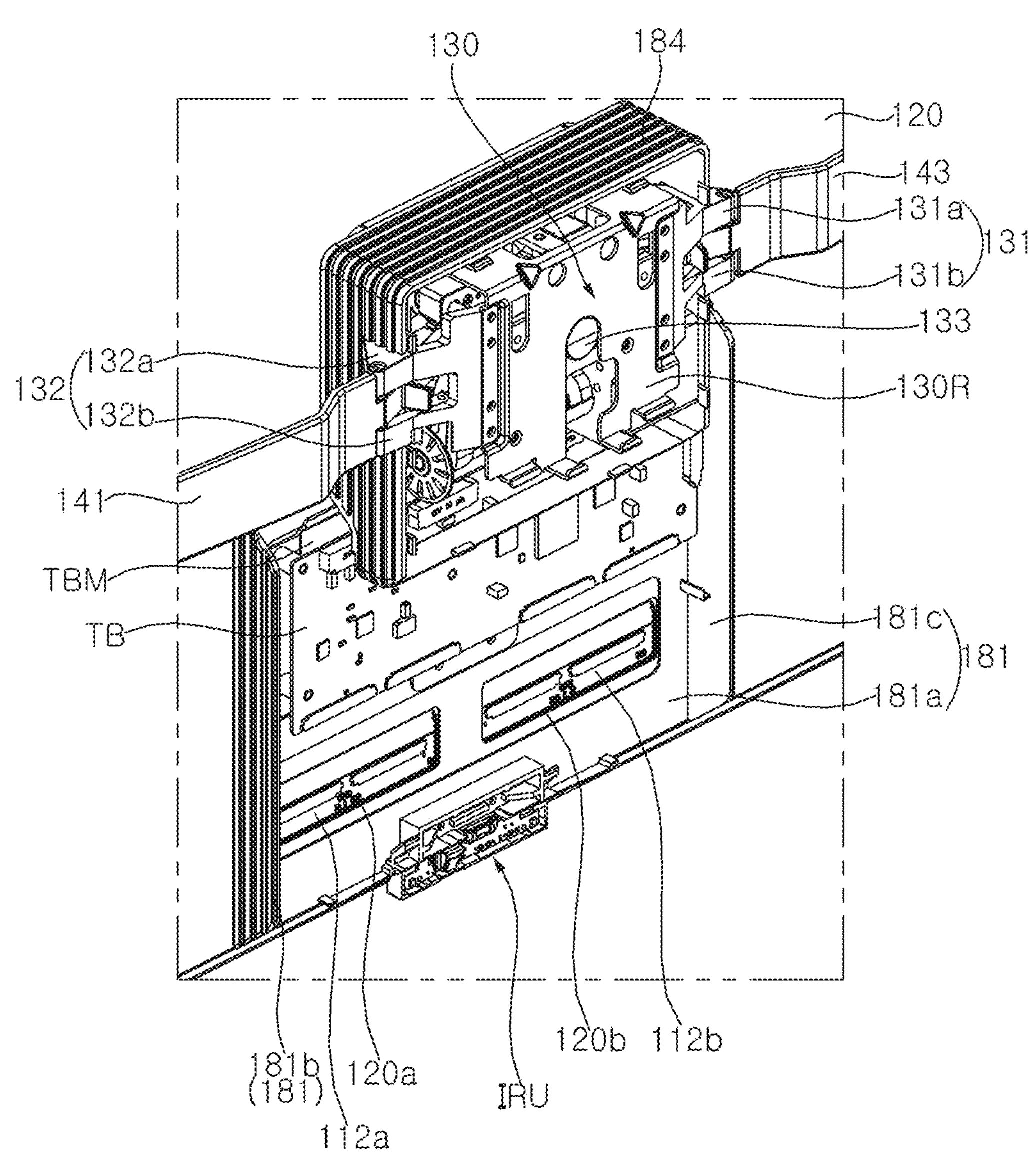

[FIG. 10]
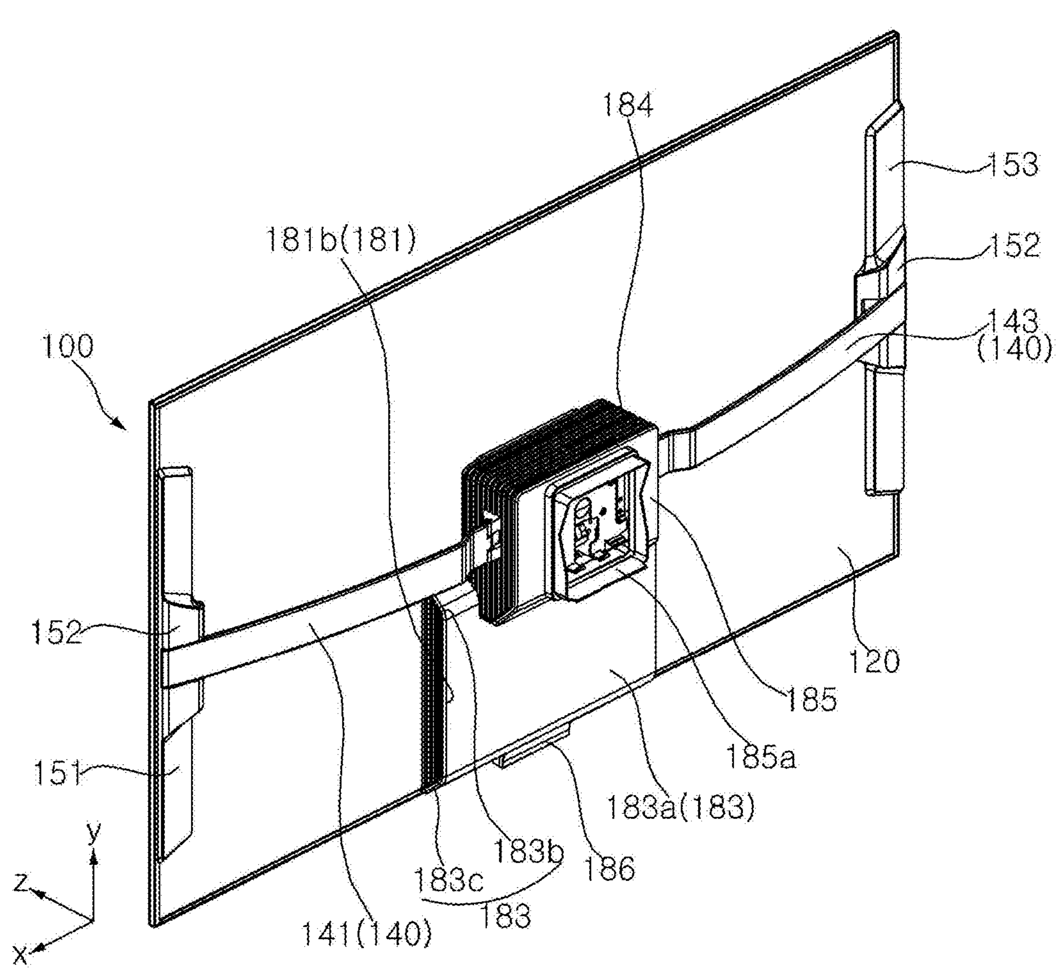

[FIG. 11]
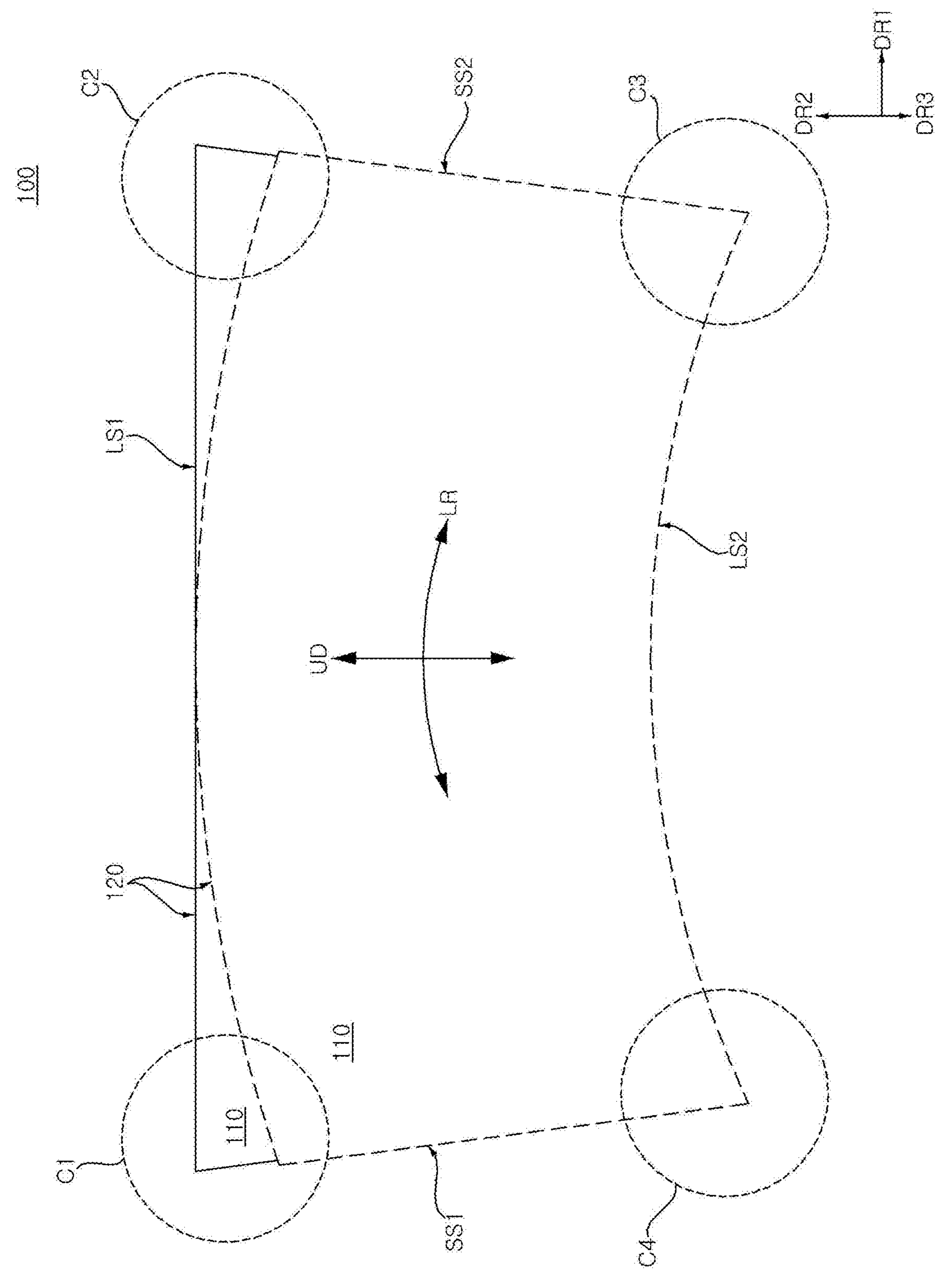

[FIG. 12]
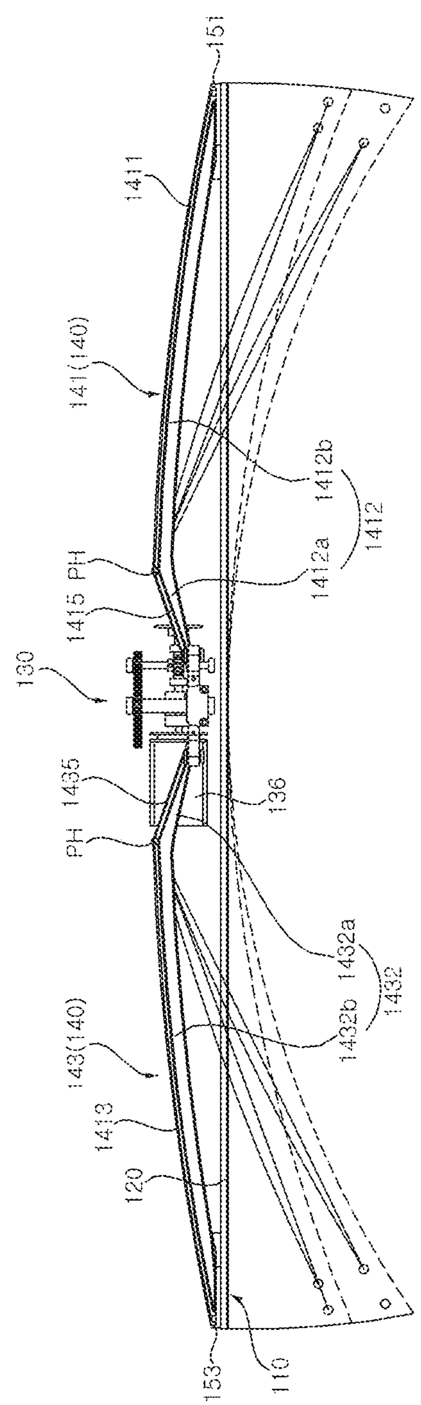

[FIG. 13]
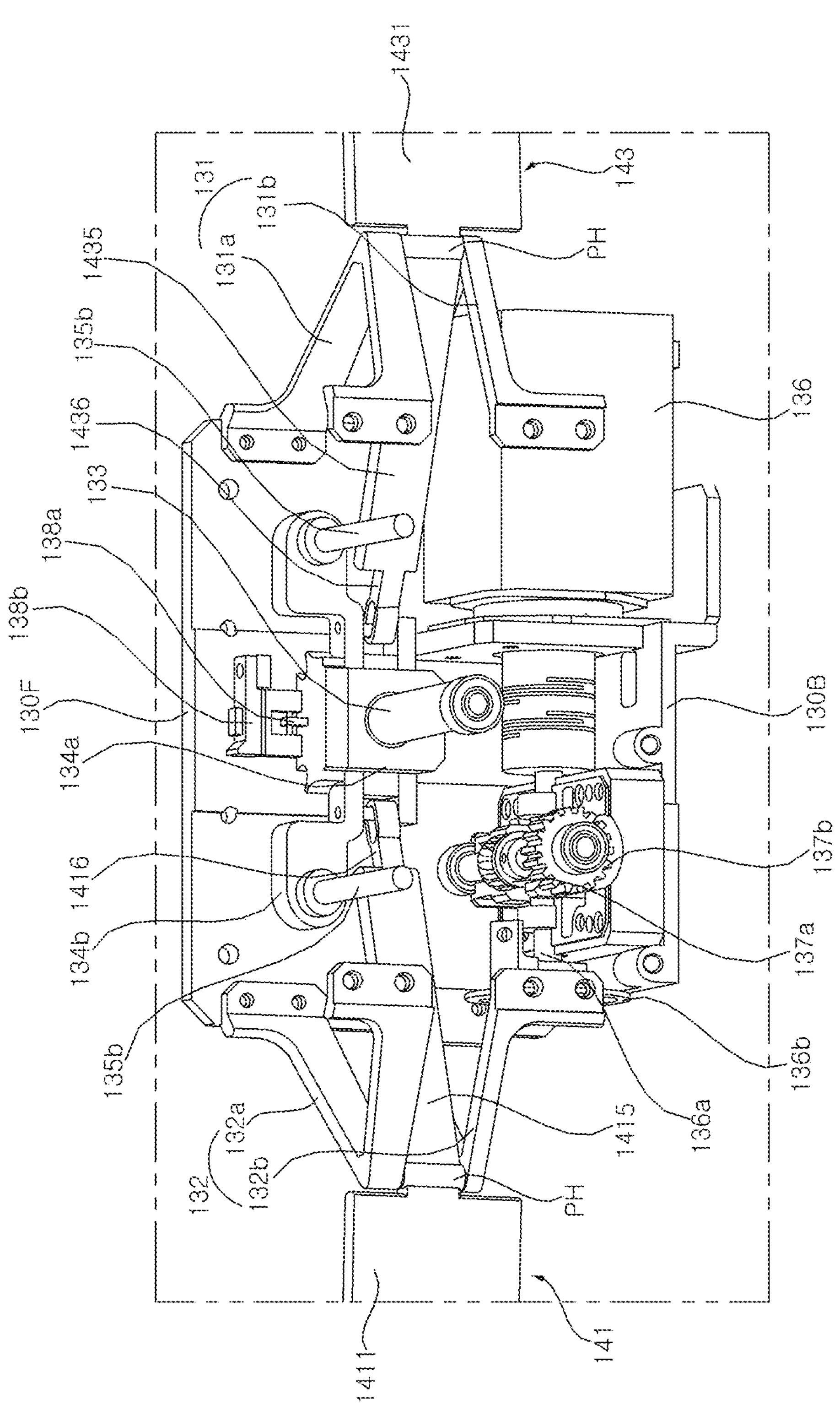

[FIG. 14]
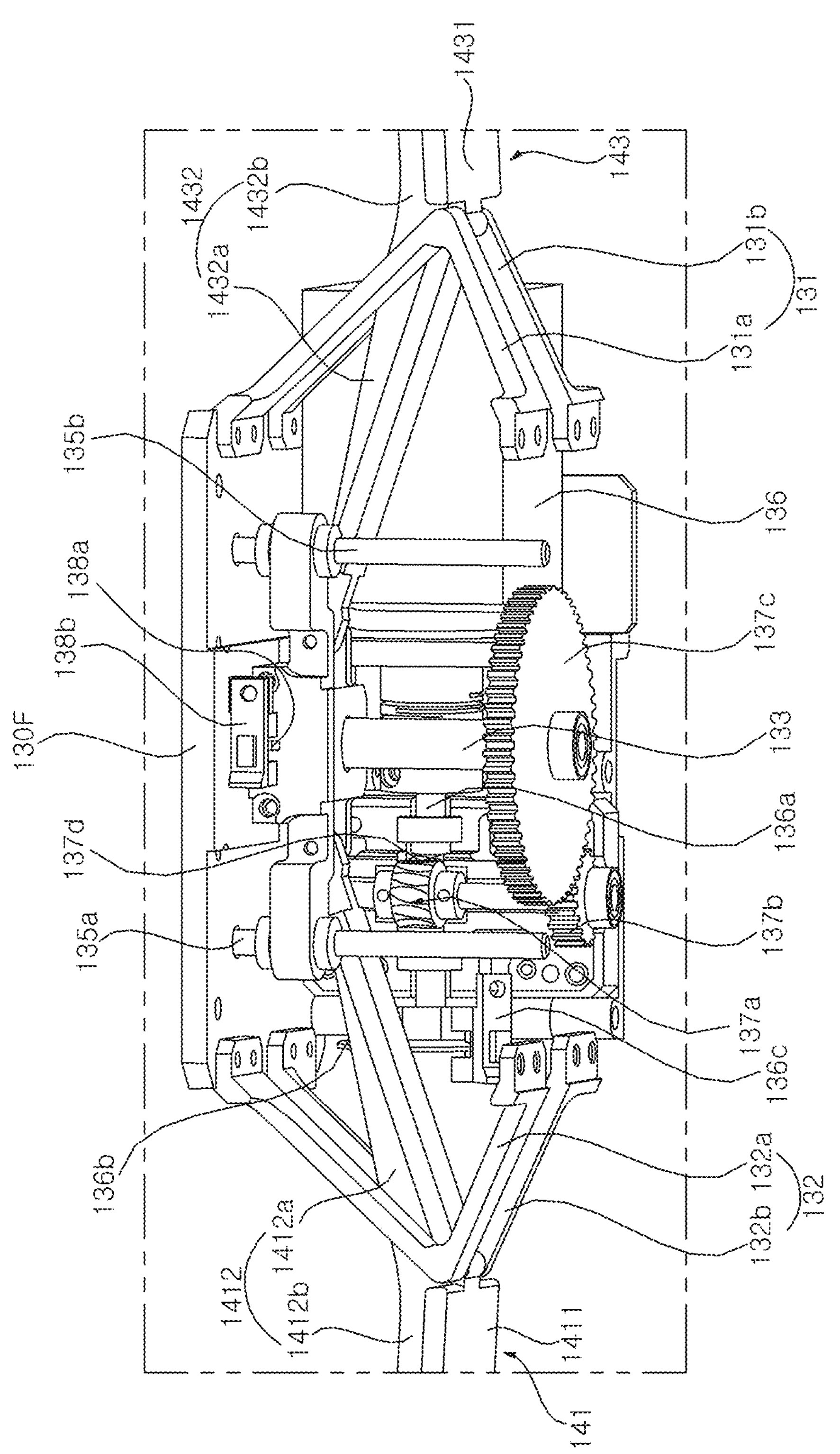

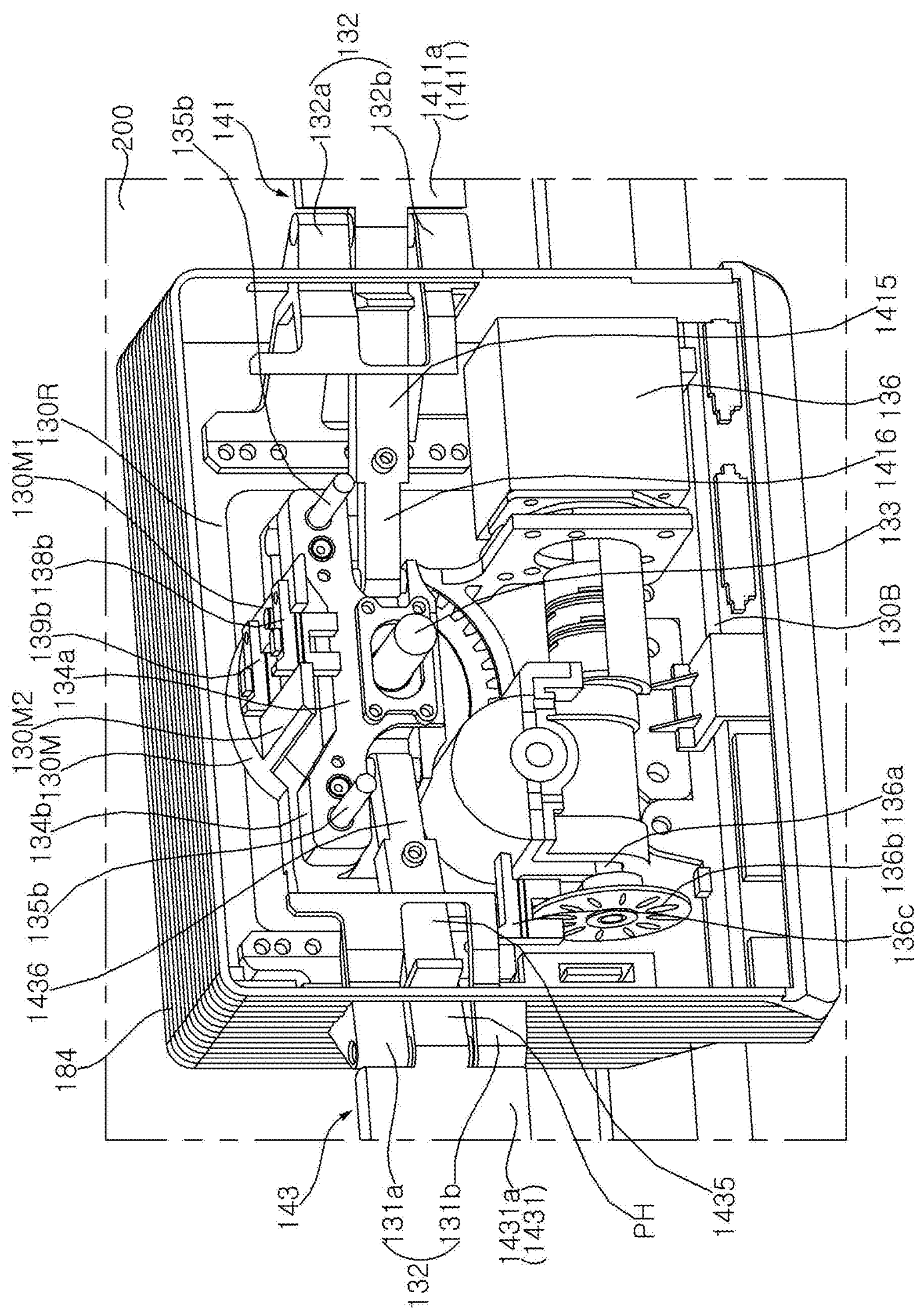
[FIG. 15]

[FIG. 16]
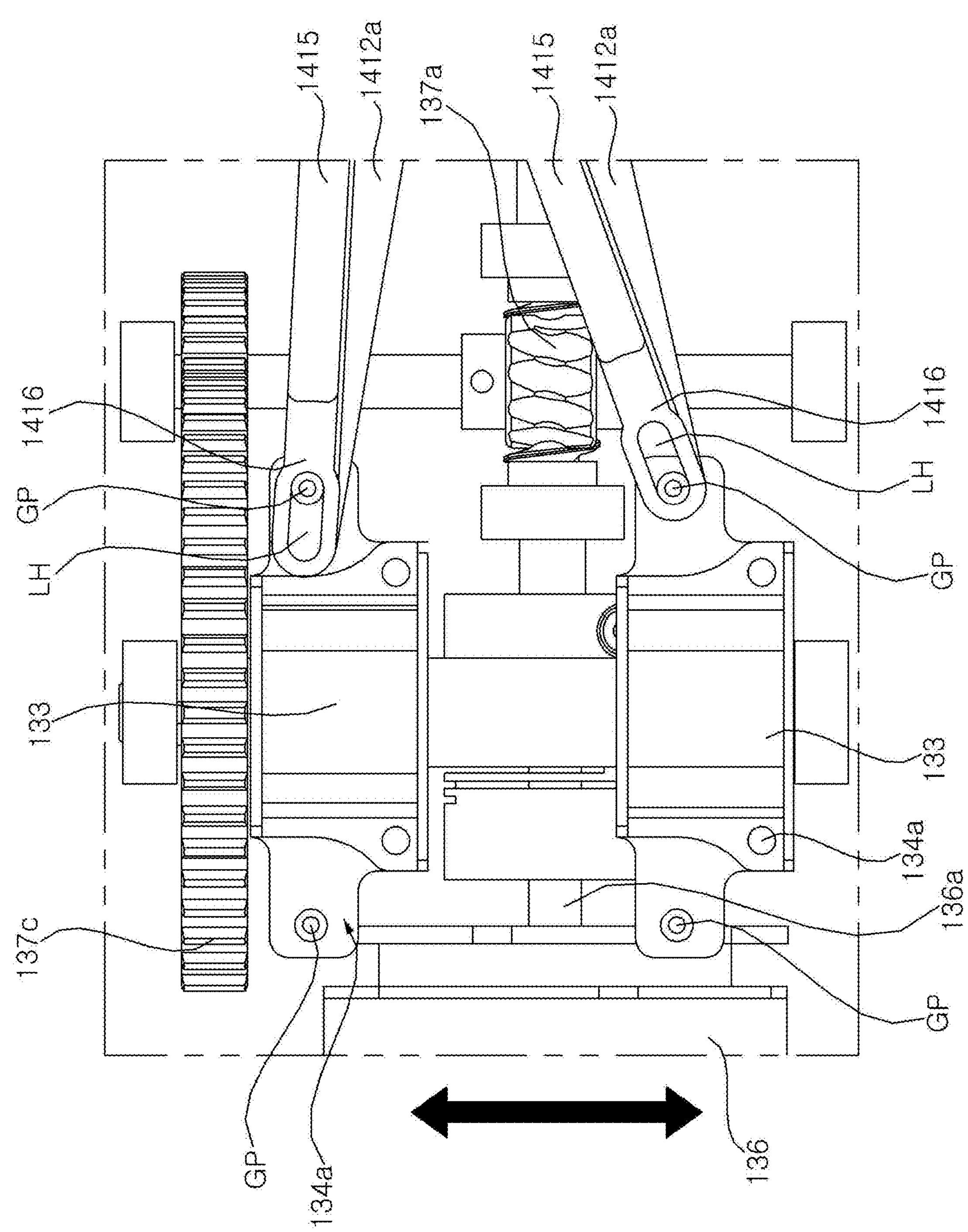

[FIG. 17]
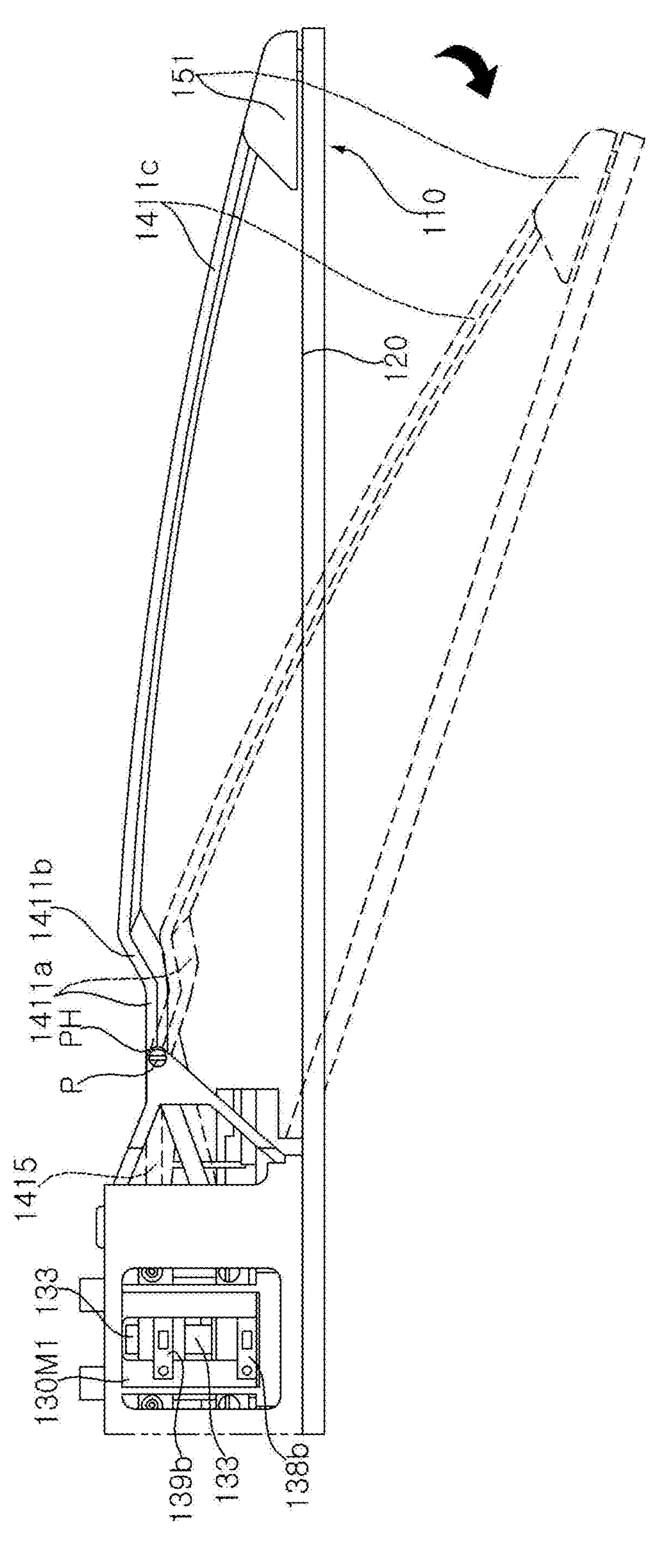

[FIG. 18]
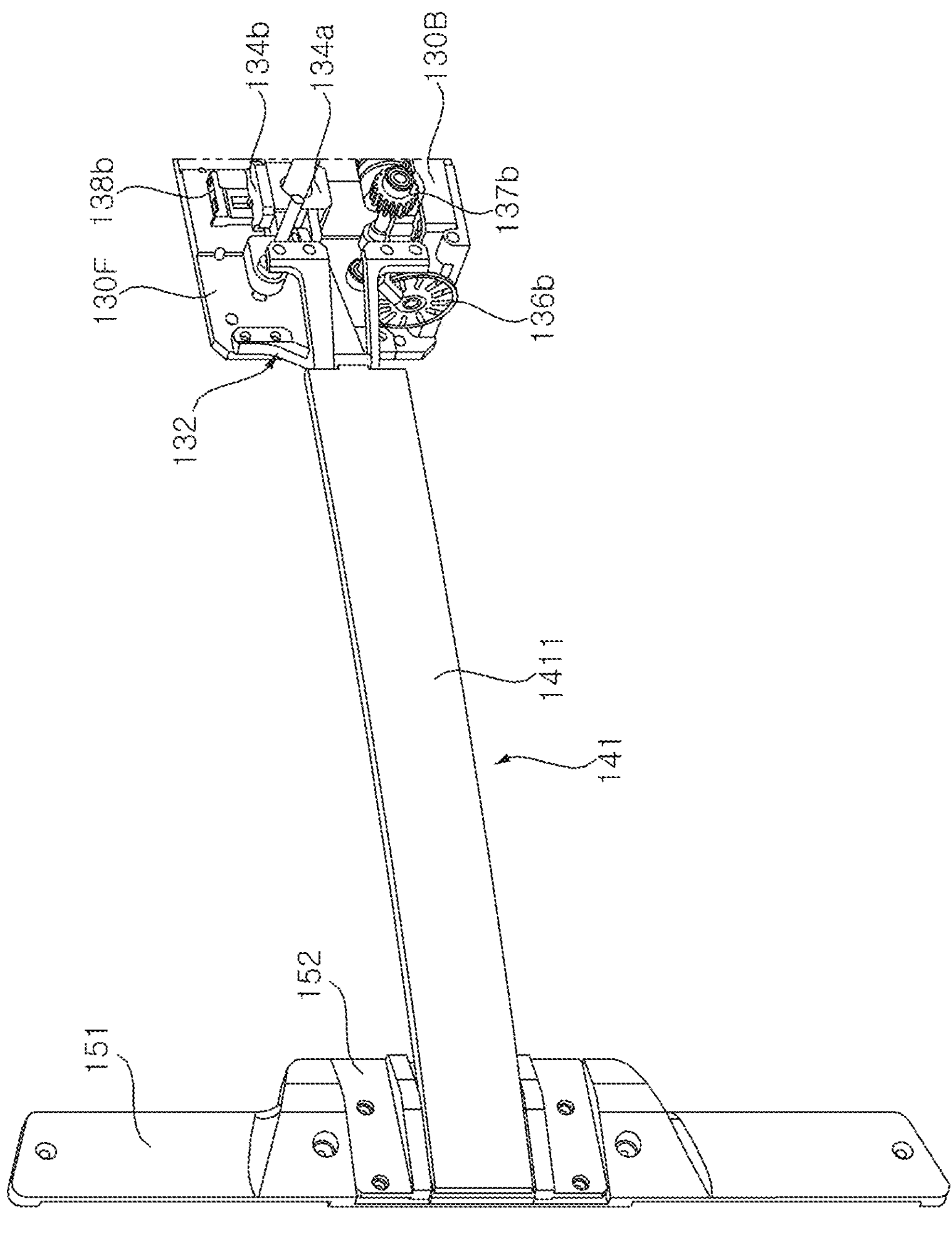

[FIG. 19]
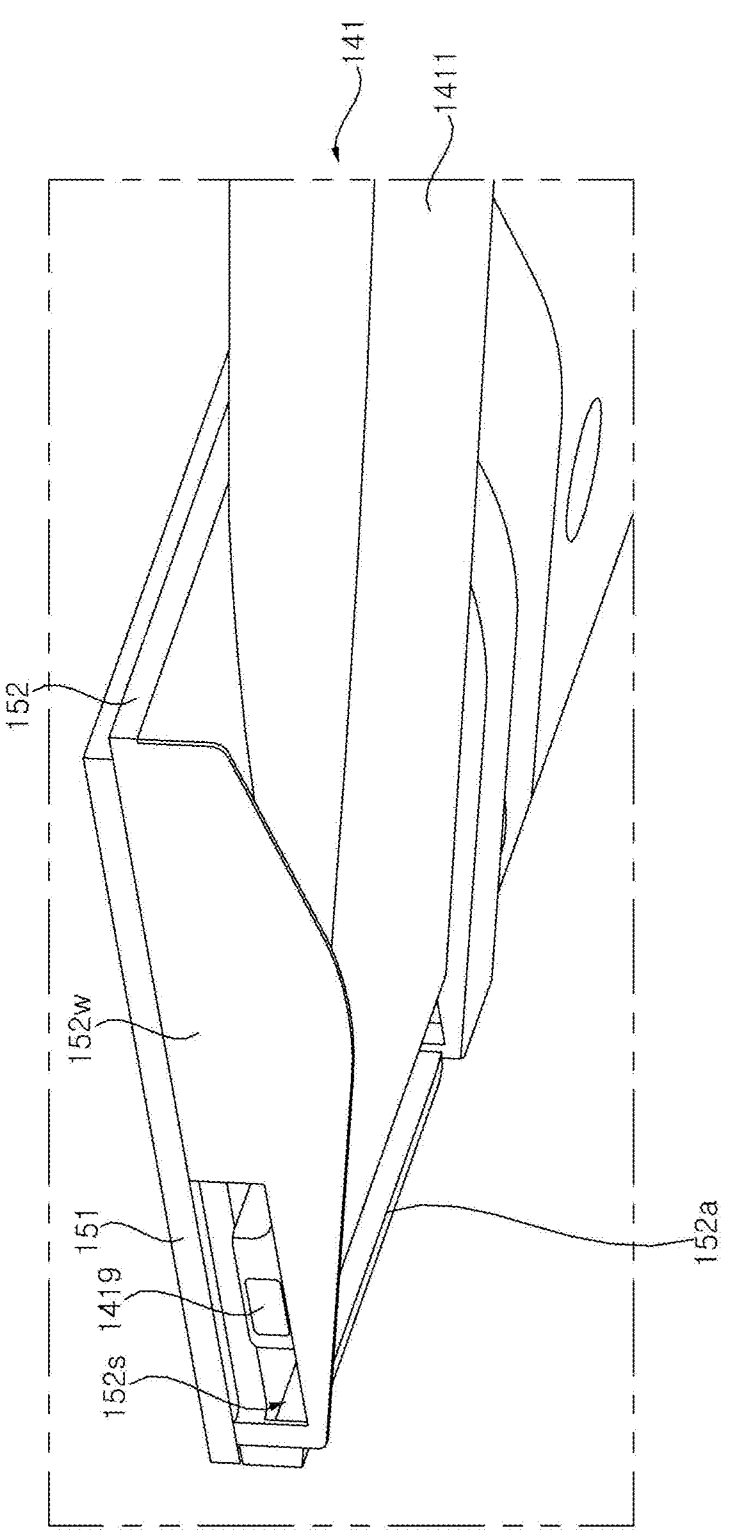

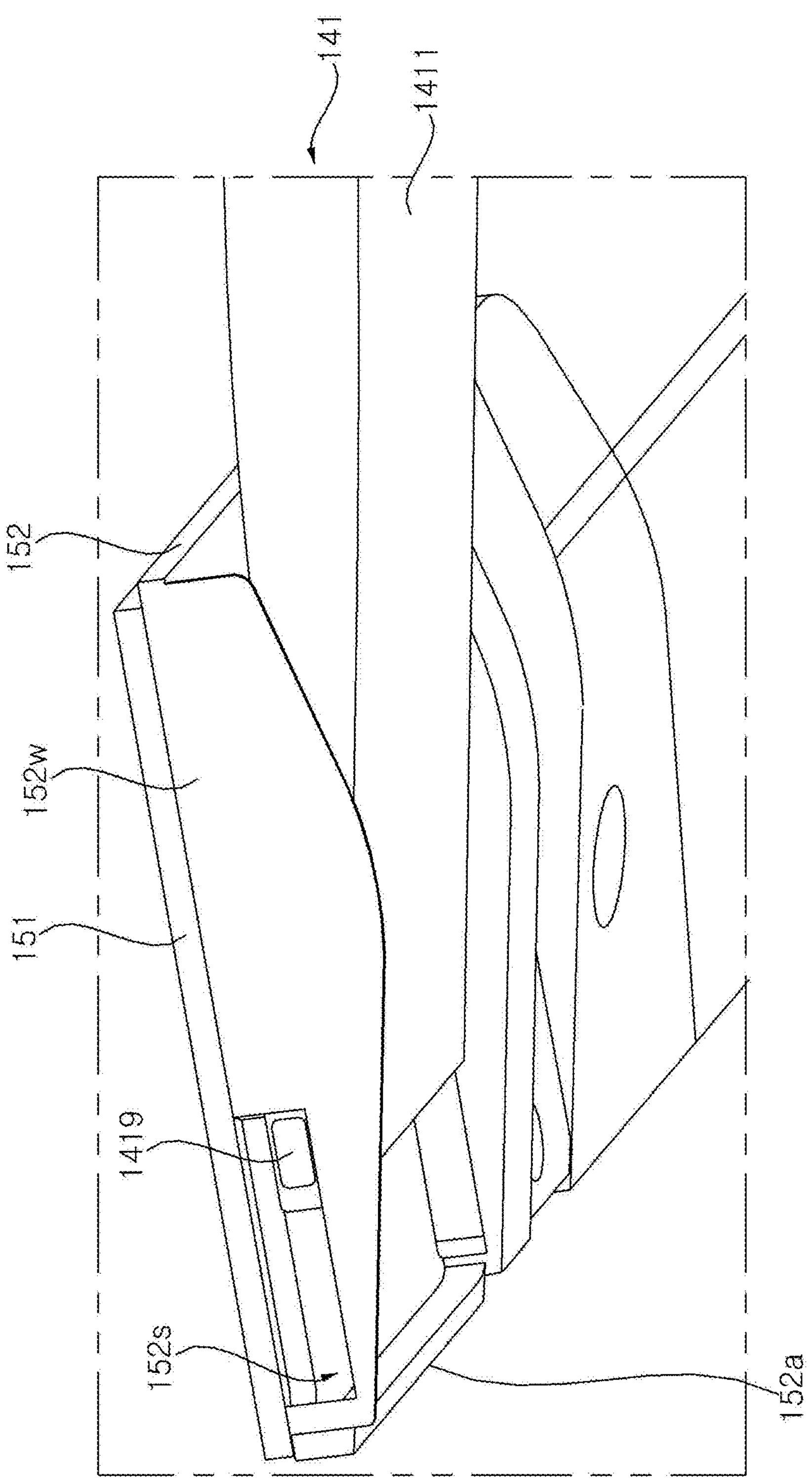
[FIG. 20]

[FIG. 21]
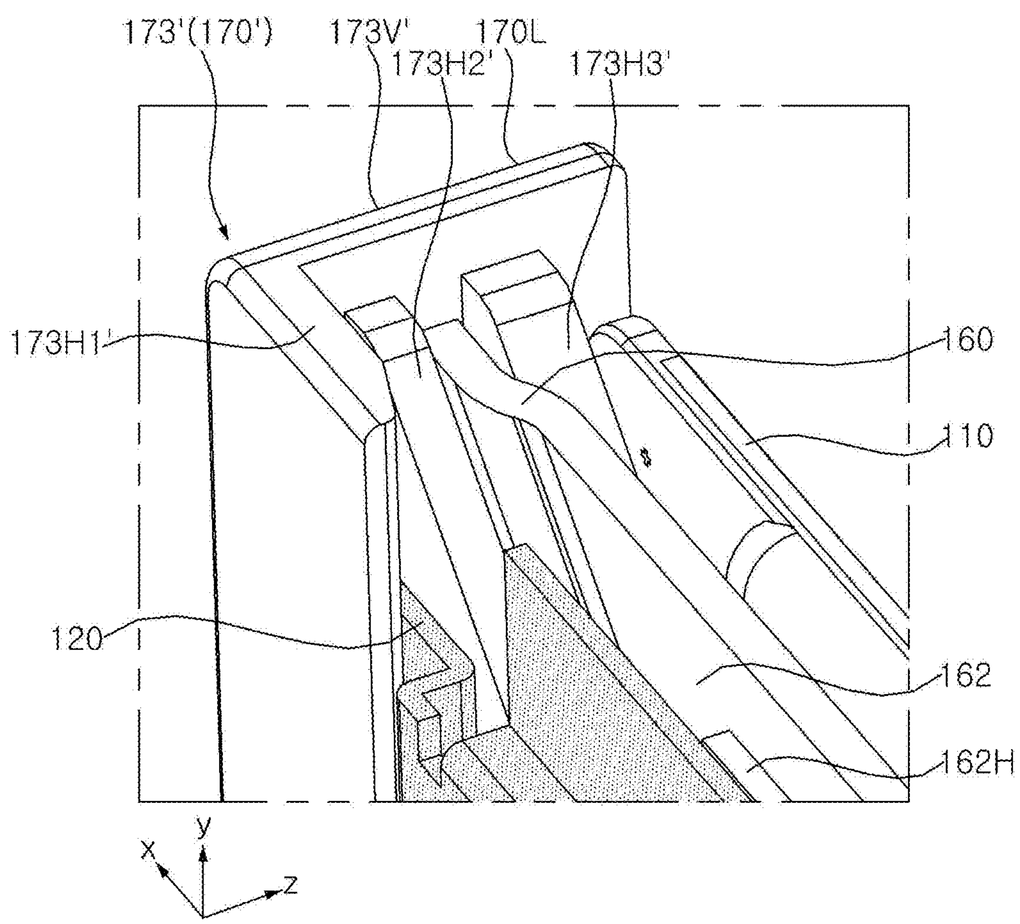

[FIG. 22]
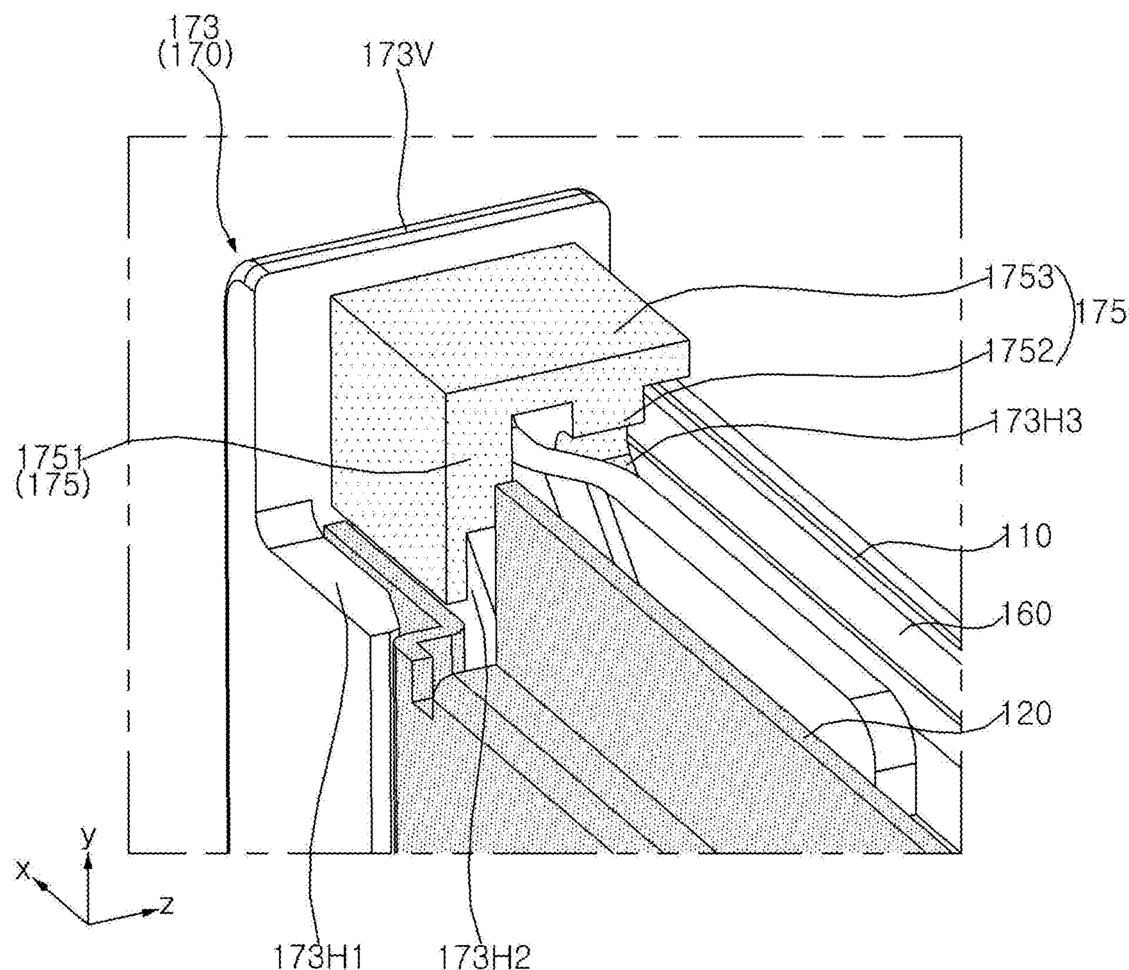

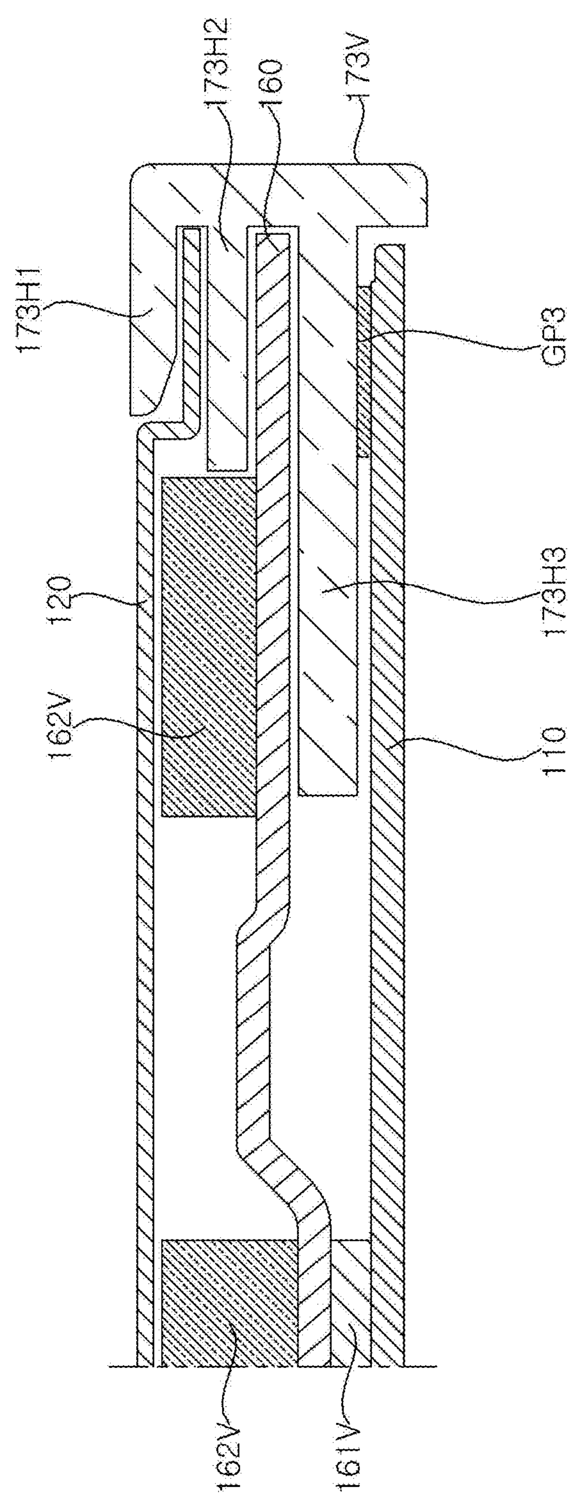
[FIG. 23]

[FIG. 24]
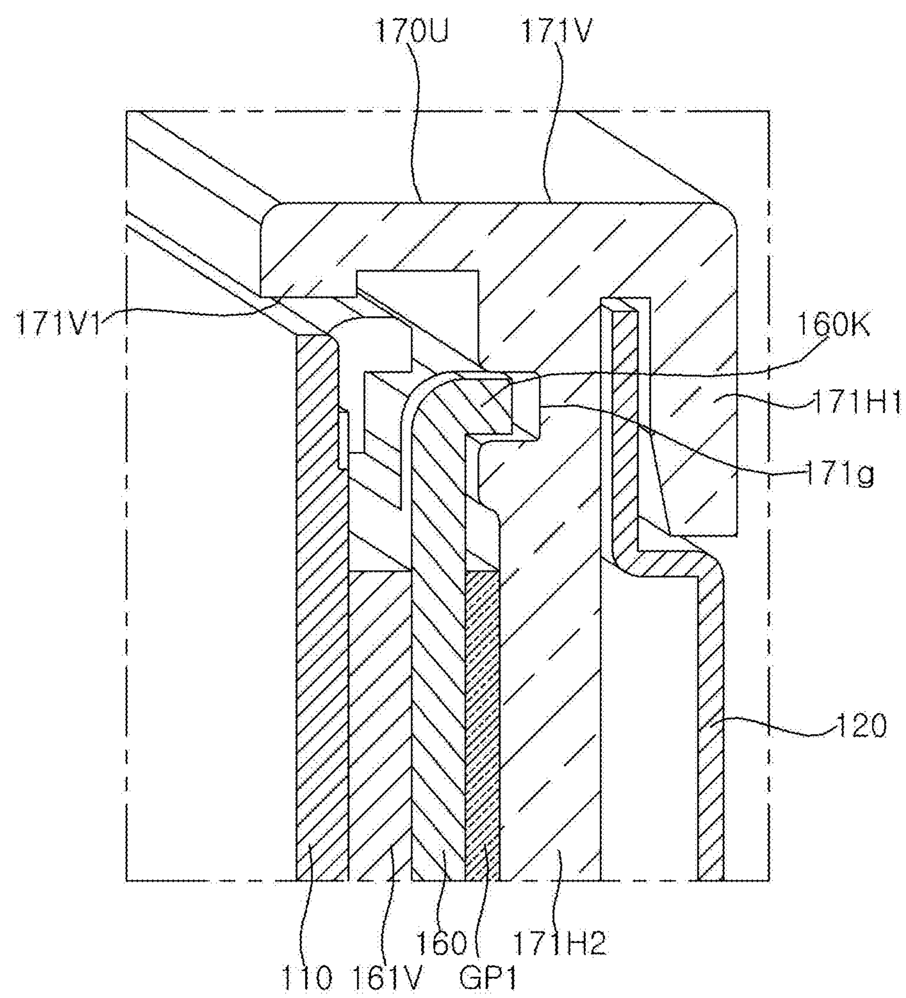

[FIG. 25]
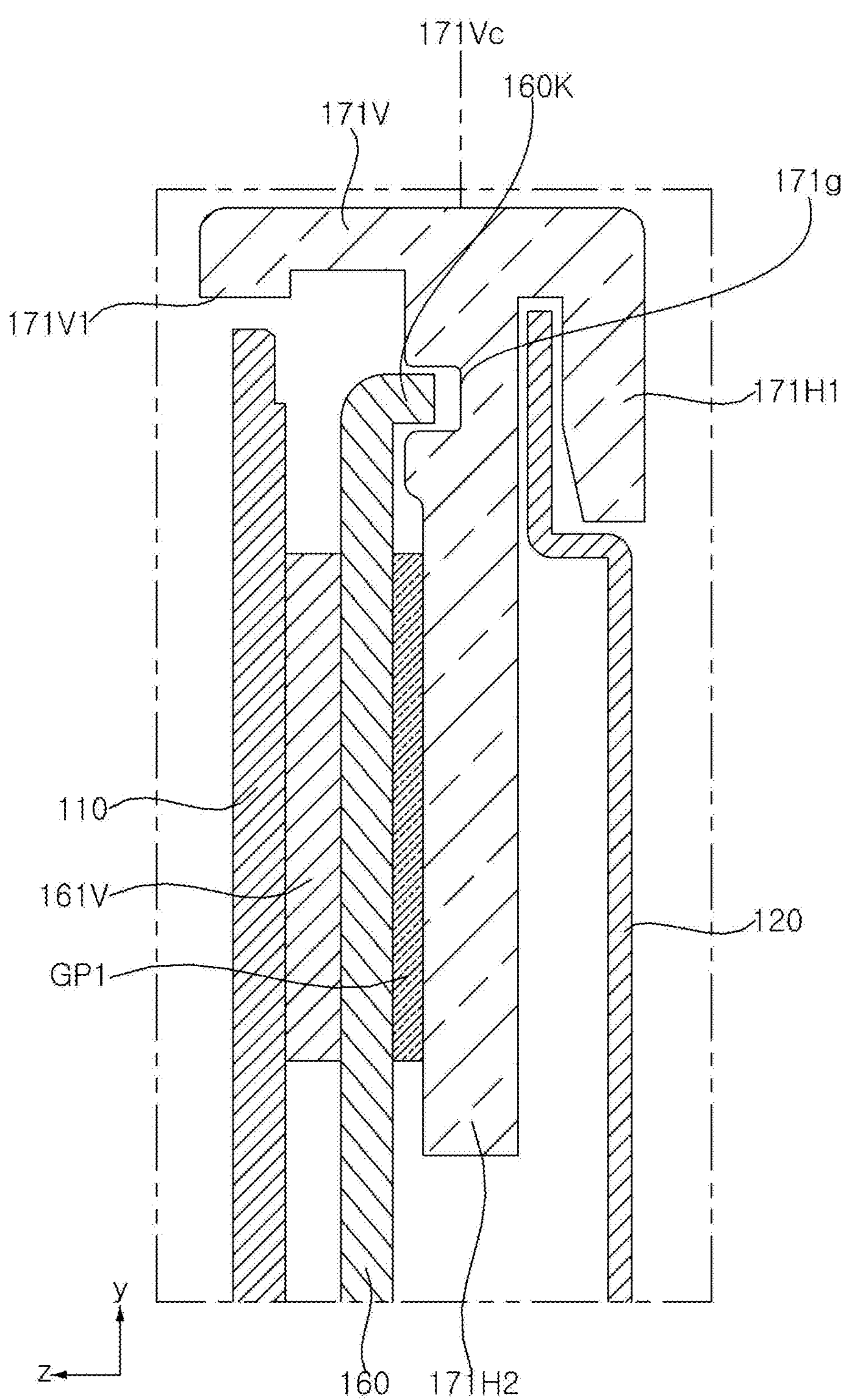

[FIG. 26]
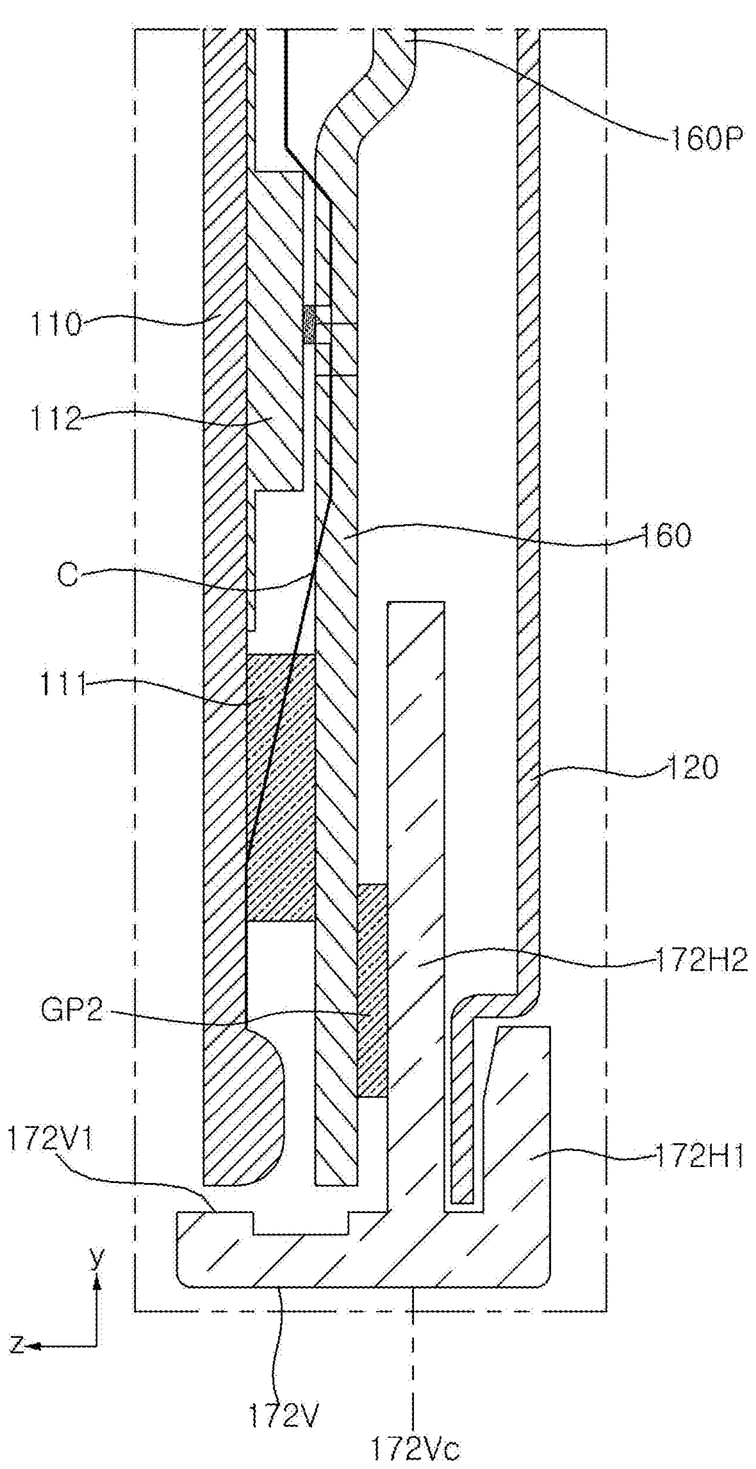

[FIG. 27]
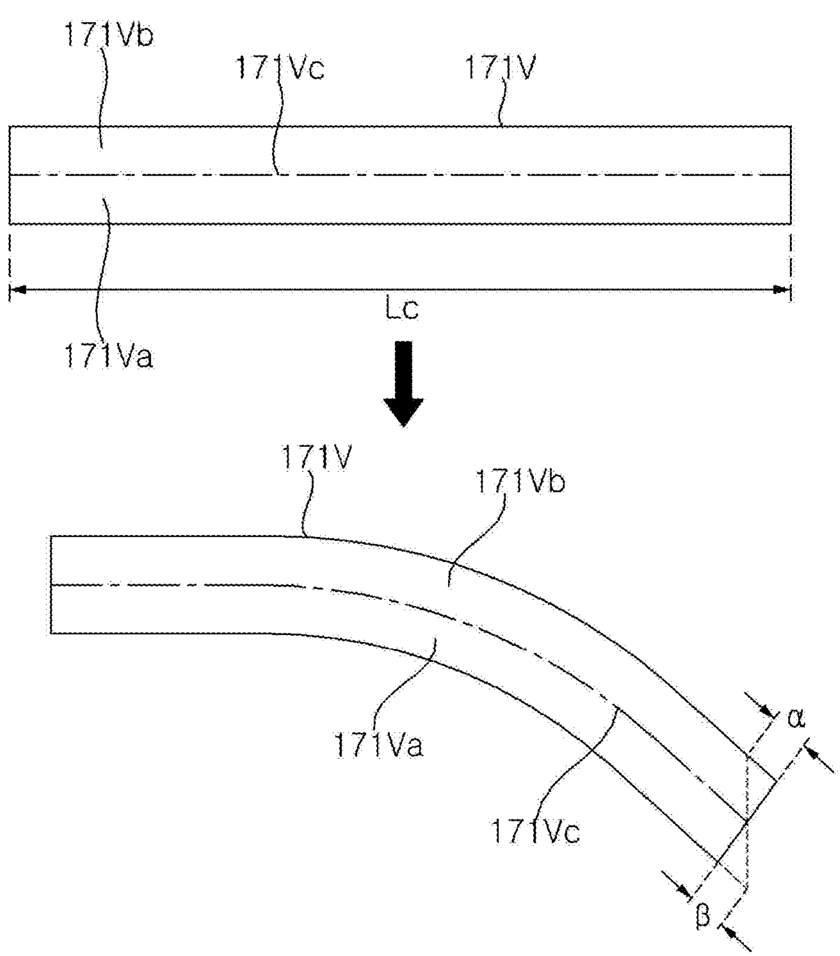

[FIG. 28]
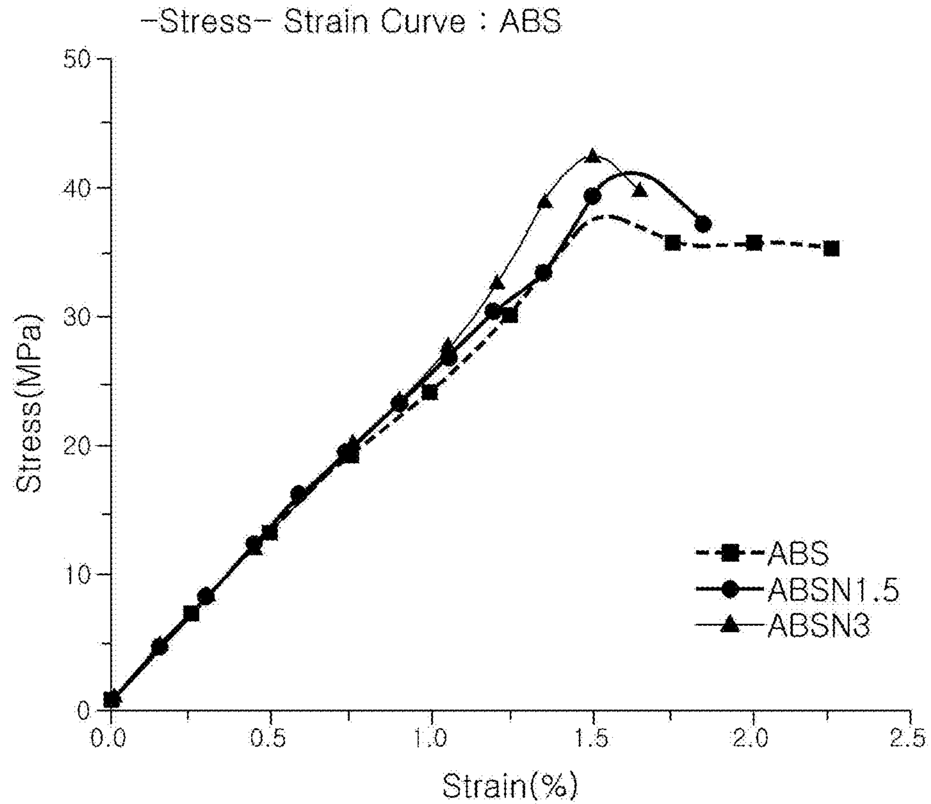

[FIG. 29]
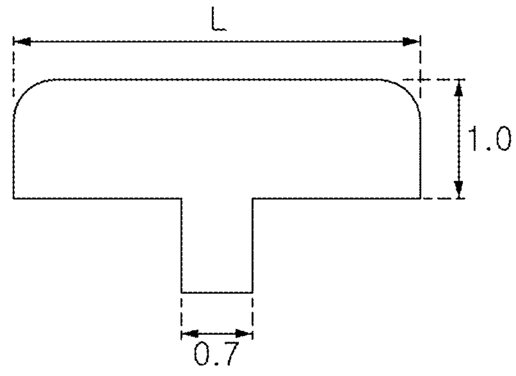
700R
| Length | σ(Mpa) | E(Mpa) | ε |
|---|---|---|---|
| 3.4 | 7.5 | 3,100 | 0.002429 |
| 6.0 | 13.3 | 3,100 | 0.004286 |
| 6.5 | 14.4 | 3,100 | 0.004643 |
| 7.0 | 15.5 | 3,100 | 0.005 |
1000R
| Length | σ(Mpa) | E(Mpa) | ε |
|---|---|---|---|
| 3.4 | 5.3 | 3,100 | 0.0017 |
| 6.0 | 9.3 | 3,100 | 0.003 |
| 6.5 | 10.1 | 3,100 | 0.00325 |
| 7.0 | 10.9 | 3,100 | 0.0035 |

DISPLAY DEVICE WITH INNER PLATE AND FRAME

CROSS REFERENCE TO RELATED APPLICATIONS

This application is the National Phase of PCT/KR2022/007896 filed on Jun. 3, 2022, which is hereby expressly incorporated by reference into the present application.

TECHNICAL FIELD

The present disclosure relates to a display device. More particularly, the present disclosure relates to a display device capable of changing a curvature of a display panel.

BACKGROUND ART

With the development of information society, there has been a growing demand for various types of display devices. In order to meet such demand, various display devices, such as a liquid crystal display (LCD), a plasma display panel (PDP), an electro luminescent display (ELD), a vacuum fluorescent display (VFD), an organic light emitting diode (OLED) display, and the like, have been developed and used.

An OLED panel can display an image by depositing an organic material layer capable of emitting light by itself on a substrate on which a transparent electrode is formed. OLED panels may not only be thin, but also have flexible characteristics. Research has been actively conducted on the structural characteristics of a display device having such an OLED panel.

DETAILED DESCRIPTION OF INVENTION

Technical Problems

It is an object of the present disclosure to solve the above and other problems.

Another object may be to provide a structure that allows the curvature of a display panel to be freely changed.

Another object may be to provide a mechanism that allows the curvature of a display panel to be freely changed.

Another object may be to provide a frame that can be bent or flat along with a display panel while covering edges of the display panel.

Another object may be to provide a frame that can be elastically deformed when a display panel is bent.

Another object may be to provide a coupling structure between a display panel and a frame.

Another object may be to provide a coupling structure between an inner plate and a frame.

Another object may be to provide a coupling structure between a plate and a frame.

Another object may be to provide a slip structure among a display panel, an inner plate, a plate, and a frame.

Another object may be to provide a structure that can minimize the thickness of a display device.

Technical Solution

In accordance with an aspect of the present disclosure for achieving the above and other objects, a display device may include: a flexible display panel; a flexible inner plate positioned behind the display panel and to which the display panel is coupled; and a frame covering an edge of the inner plate, wherein the frame may include a first frame extending along a first side of the inner plate, the first frame being fixed to the inner plate such that the first frame is bent or flat along with the inner plate, and wherein the first frame may be elastically deformed when the inner plate is bent.

Effect of Invention

The display device according to the present disclosure has the following effects.

According to at least one of the embodiments of the present disclosure, it is possible to provide a structure that allows the curvature of a display panel to be freely changed.

According to at least one of the embodiments of the present disclosure, it is possible to provide a mechanism that allows the curvature of a display panel to be freely changed.

According to at least one of the embodiments of the present disclosure, it is possible to provide a frame that can be bent or flat along with a display panel while covering edges of the display panel.

According to at least one of the embodiments of the present disclosure, it is possible to provide a frame that can be elastically deformed when a display panel is bent.

According to at least one of the embodiments of the present disclosure, it is possible to provide a coupling structure between a display panel and a frame.

According to at least one of the embodiments of the present disclosure, it is possible to provide a coupling structure between an inner plate and a frame.

According to at least one of the embodiments of the present disclosure, it is possible to provide a coupling structure between a plate and a frame.

According to at least one of the embodiments of the present disclosure, it is possible to provide a slip structure among a display panel, an inner plate, a plate, and a frame.

According to at least one of the embodiments of the present disclosure, it is possible to provide a structure that can minimize the thickness of a display device.

Further scope of applicability of the present disclosure will become apparent from the following detailed description. However, it should be understood that the detailed description and specific embodiments such as preferred embodiments of the present disclosure are given by way of example only, since various changes and modifications within the idea and scope of the present disclosure may be clearly understood by those skilled in the art.

BRIEF DESCRIPTION OF THE DRAWING

FIGS. 1 to 29 are diagrams illustrating examples of a display device according to embodiments of the present disclosure.

MODE FOR CARRYING OUT THE INVENTION

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In the following description, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to help easily understand the technical idea of the present disclosure and it should be understood that the idea of the present disclosure is not limited by the accompanying drawings. The idea of the present disclosure should be construed to extend to any alterations, equivalents, and substitutes besides the accompanying drawings.

Although the terms “first”, “second”, etc. may be used herein to describe various elements, these elements should not be limited by these terms. These terms are only used to distinguish one element from another.

It will be understood that when a component is referred to as being “connected to” or “coupled to” another component, it may be directly connected to or coupled to another component, or intervening components may be present. In contrast, when a component is referred to as being “directly connected to” or “directly coupled to” another component, there are no intervening components present.

As used herein, a singular representation is intended to include a plural representation unless the context clearly indicates otherwise.

It will be further understood that the terms “comprises or includes” and/or “has” when used in this specification, specify the presence of a stated feature, number, step, operation, component, element, or combination thereof, but do not preclude the presence or addition of one or more other features, numbers, steps, operations, components, elements, or combinations thereof.

The directions “up (U)”, “down (D)”, “left (Le)”, “right (Ri)”, “front (F)”, and “rear (R)” shown in the drawings are only for the convenience of description, and the inventive concept disclosed in this specification is not limited by these directions.

Herein, a display panel will be described using an organic light emitting diode (OLED) panel as an example, but the display panel applicable to the present disclosure is not limited to the OLED panel.

Figure 1:
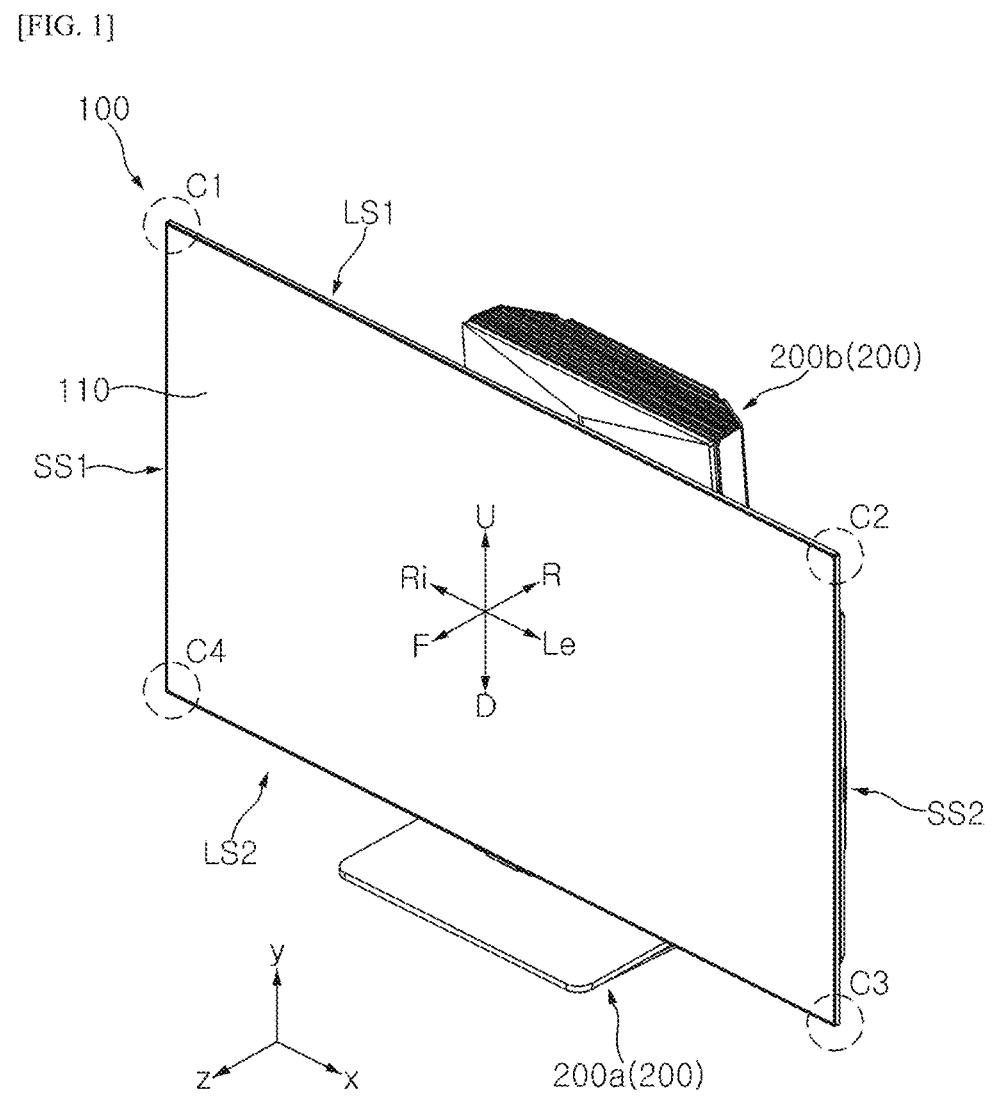

Referring to FIG. 1, a display device 100 may include a display panel 110. The display panel 110 may define a front surface of the display device 100, and may display an image forward.

The display device 100 may include a first long side LS1, a second long side LS2 opposite the first long side LS1, a first short side SSI adjacent to the first long side LS1 and the second long side LS2, and a second short side SS2 opposite the first short side SS1. For ease of explanation, it is illustrated and described that lengths of the first and second long sides LS1 and LS2 are greater than lengths of the first and second short sides SSI and SS2, but the lengths of the first and second long sides LS1 and LS2 may be substantially equal to the lengths of the first and second short sides SS1 and SS2.

A direction parallel to the long sides LS1 and LS2 of the display device 100 may be referred to as a left-and-right direction. A direction parallel to the short sides SSI and SS2 of the display device 100 may be referred to as an up-and-down direction. A direction perpendicular to the long sides LS1 and LS2 and the short sides SSI and SS2 of the display device 100 may be referred to as a front-and-rear direction.

A direction in which the display device 100 displays an image may be referred to as a front (F, z), and a direction opposite to the front may be referred to as a rear (R). The first short side SS1 may be referred to as a right side (Ri). The second short side SS2 may be referred to as a left side (Le, x). The first long side LS1 may be referred to as an upper side (U, y). The second long side LS2 may be referred to as a lower side (D).

The first long side LS1, the second long side LS2, the first short side SS1, and the second short side SS2 may be referred to as edges of the display device 100. In addition, points where the first long side LS1, the second long side LS2, the first short side SS1, and the second short side SS2 meet one another may be referred to as corners.

A point where the first short side SSI and the first long side LSI meet may be referred to as a first corner C1. A point where the first long side LS1 and the second short side SS2 meet may be referred to as a second corner C2. A point where the second short side SS2 and the second long side LS2 meet may be referred to as a third corner C3. A point where the second long side LS2 and the first short side SSI meet may be referred to as a fourth corner C4.

Referring to FIGS. 1 and 2, the display device 100 may include a plate 120. The plate 120 may define a rear surface of the display device 100.

A stand 200 may include a base 200*a* and a wall 200*b*. The base 200*a* may be placed on a surface. The wall 200*b* may extend upward from a rear end of the base 200*a*. The wall 200*b* may be disposed at the rear of the plate 120 and may be coupled to the plate 120. Accordingly, the stand 200 may support the display device 100.

For example, electronic components such as a main board, a power supply board, and a speaker may be installed in the wall 200*b*, and may be electrically connected to the display device 100.

Referring to FIG. 3, the display panel 110 may be an OLED panel. The display panel 110 may define the front surface of the display device 100, and may display an image. The display panel 110 may include a plurality of pixels to output an image in accordance with color, brightness, and chroma of each pixel. The display panel 110 may generate light corresponding to red, green, or blue color in response to a control signal.

A source PCB 112 may be adjacent to a lower side 110D of the display panel 110, and may extend along the lower side 110D. The source PCB 112 may be electrically connected to the display panel 110 through a source chip on film (COF) 111. The source PCB 112 may be electrically connected to a cable (not shown) such as a flexible flat cable (FFC). For example, a first source PCB 112*a* may extend to the left and right between a left side 110L of the display panel 110 and a central portion of the display panel 110, and may be electrically connected to a first FFC (not shown). For example, a second source PCB 112*b* may extend to the left and right between a right side 110R of the display panel 110 and the central portion of the display panel 110, and may be electrically connected to a second FFC (not shown).

An inner plate 160 may be disposed at the rear of the display panel 110. The inner plate 160 may have a shape corresponding to the display panel 110. A cable hole 160*a*, 160*b* may be adjacent to a lower side 160D of the inner plate 160, and may be formed through the inner plate 160. The cable, such as an FFC, connected to the source PCB 112 may pass through the cable hole 160*a*, 160*b*.

A plurality of holes 160*h* may be offset from a central portion of the inner plate 160 to the left or right, may be sequentially arranged between an upper side 160U and the lower side 160D of the inner plate 160, and may be formed through the inner plate 160. A plurality of pressed parts 160*r* may be disposed at the central portion of the inner plate 160, may be sequentially arranged between the upper side 160U and the lower side 160D of the inner plate 160, and may be formed by being recessed from one surface (or a first surface) to the other surface (or a second surface) of the inner plate 160.

A plurality of front adhesive members 161H and 161V may be coupled to a front surface 161 of the inner plate 160. Some of the front adhesive members 161H and 161V may be adjacent to edges of the inner plate 160. Horizontal adhesive members 161H may extend horizontally. Vertical adhesive members 161V may extend vertically. For example, the plurality of front adhesive members 161H and 161V may be double-sided tapes.

Referring to FIGS. 4 and 5, a plurality of rear adhesive members 162H and 162V may be coupled to a rear surface 162 of the inner plate 160. Some of the rear adhesive members 162H and 162V may be adjacent to edges of the inner plate 160. Horizontal adhesive members 162H may extend horizontally. Vertical adhesive members 162V may extend vertically. For example, the plurality of rear adhesive members 162H and 162V may be double-sided tapes.

A first frame 171 may be adjacent to the upper side 160U of the inner plate 160, and may extend along the upper side 160U. The first frame 171 may cover the upper side 160U. The first frame 171 may be referred to as a top cover 171 or a top frame 171.

A second frame 172 may be adjacent to the lower side 160D of the inner plate 160, and may extend along the lower side 160D. The second frame 172 may cover the lower side 160D. The second frame 172 may be referred to as a bottom cover 172 or a bottom frame 172.

A third frame 173 may be adjacent to a left side 160L of the inner plate 160, and may extend along the left side 160L. The third frame 173 may cover the left side 160L. The third frame 173 may be referred to as a side cover 173 or a side frame 173.

A fourth frame 174 may be adjacent to a right side 160R of the inner plate 160, and may extend along the right side 160R. The fourth frame 174 may cover the right side 160R. The fourth frame 174 may be referred to as a side cover 174 or a side frame 174.

A frame 170 may define the edges of the display device 100. That is, the first frame 171 may define the first long side LS1, the second frame 172 may define the second long side LS2, the third frame 173 may define the second short side SS2, and the fourth frame 174 may define the first short side SS1 (see FIG. 1). The first frame 171, the second frame 172, the third frame 173, and the fourth frame 174 may be separated from each other at the corners C1, C2, C3, and C4 (see FIG. 1). The frame 170 may be referred to as a middle cabinet 170, a panel guide 170, an end cover 170, or a case top 170.

For example, the frame 170 may include a metal material such as aluminum (Al). As another example, the frame 170 may include a plastic or resin material.

The third frame 173 and the fourth frame 174 may be fixed to the display panel 110. The first frame 171 and the second frame 172 may be fixed to the inner plate 160 and may be bent or flat along with the inner plate 160.

Meanwhile, the first frame 171 and the second frame 172 may be up-down symmetric, and the third frame 173 and the fourth frame 174 may be left-right symmetric. That is, the description of the first frame 171 may be equally applied to the second frame 172 (and vice versa), and the description of the third frame 173 may be equally applied to the fourth frame 174 (and vice versa).

Referring to FIG. 6, a rear surface of the display panel 110 may be positioned in front of the front surface 161 of the inner plate 160, and may be coupled to the plurality of front adhesive members 161H and 161V. Accordingly, the display panel 110 may be coupled to the inner plate 160.

Referring to FIG. 7, a front surface of the plate 120 may be positioned in rear of the rear surface 162 of the inner plate 160, and may be coupled to the plurality of rear adhesive members 162H and 162V. Accordingly, the plate 120 may be coupled to the inner plate 160. The plate 120 may be referred to as an outer plate 120.

A cable hole 120*a*, 120*b* may be formed through the plate 120. The cable hole 120*a*, 120*b* of the plate 120 may be aligned with the cable hole 160*a*, 160*b* of the inner plate 160 in the front-and-rear direction.

A side fixing part 162P may protrude rearward from the rear surface 162 of the inner plate 160. The side fixing part 162P may be a PEM nut. Among a plurality of side fixing parts 162P, side fixing parts adjacent to the left side of the inner plate 160 may be spaced apart from one another in the up-and-down direction, and may pass through the plate 120. Among the plurality of side fixing parts 162P, side fixing parts adjacent to the right side of the inner plate 160 may be spaced apart from one another in the up-and-down direction, and may pass through the plate 120. The side fixing parts 162P adjacent to the right side of the inner plate 160 may be referred to as first side fixing parts 162P, and the side fixing parts 162P adjacent to the left side of the inner plate 160 may be referred to as second side fixing parts 162P.

A center fixing part 162F may protrude rearward from the rear surface of the inner plate 160. The center fixing part 162F may be a PEM nut. A plurality of center fixing parts 162F may be disposed at the central portion of the inner plate 160, may be spaced apart from one another in the up-and-down direction, and may pass through the plate 120.

A locking recess 120F may be formed through the plate 120. A plurality of locking recesses 120F may be disposed in the vicinity of the plurality of center fixing parts 162F.

Referring to FIG. 8, a bracket 180 may be disposed at the rear of the plate 120. A plurality of locking protrusions (not shown) may protrude forward from a front surface of the bracket 180, may be arranged along a periphery of the bracket 180, and may be locked in the plurality of locking recesses 120F. A plurality of fastening members such as screws may pass through the bracket 180 to be fastened to the plurality of center fixing parts 162F. Accordingly, the bracket 180 may be coupled to the plate 120.

The bracket 180 may include a first bracket 181 and a second bracket 182. For example, the first bracket 181 and the second bracket 182 may be formed as one body.

The first bracket 181 may be adjacent to a lower side of the plate 120, and may have a hole corresponding to the cable hole 120*a*, 120*b* of the plate 120.

The second bracket 182 may extend upward from the first bracket 181. The second bracket 182 may be smaller in size than the first bracket 181.

Referring to FIGS. 8 and 9, a first bracket base 181*a* may define a flat portion of the first bracket 181, and may be open at the front and rear. A left bending portion 181*b* may protrude rearward from a left side of the first bracket base 181*a*, and may extend vertically. A right bending portion 181*c* may protrude rearward from a right side of the first bracket base 181*a*, and may extend vertically.

A second bracket base 182*a* may define a flat portion of the second bracket 182, and may be open at the front and rear. A second bending portion 182*b* may protrude rearward from upper, left, and right sides of the second bracket base 182*a*, and may extend along a periphery of the second bracket base 182*a*.

A timing controller board TB may be coupled to the first bracket base 181*a* through a mount plate TBM. The first FFC (not shown) connected to the first source PCB 112*a* may be connected to the timing controller board TB through a first cable hole 120*a*. The second FFC (not shown) connected to the second source PCB 112*b* may be connected to the timing controller board TB through a second cable hole 120*b*.

An upper cover 184 may be coupled to the second bracket base 182*a*. The upper cover 184 may extend along the second bending portion 182*b*.

A drive module 130 may be disposed inside the upper cover 184. A rear bracket 130R of the drive module 130 may be disposed opposite a front bracket 130F (see FIG. 14), which will be described later, with respect to a lead screw 133. The lead screw 133 may connect the front bracket 130F and the rear bracket 130R. One end (or a first end) of a first wing bracket 131 may be coupled to the front bracket 130F, and the other end (or a second end) of the first wing bracket 131 may be coupled to the rear bracket 130R. One end (or a first end) of a second wing bracket 132 may be coupled to the front bracket 130F, and the other end (or a second end) of the second wing bracket 132 may be coupled to the rear bracket 130R.

Referring to FIGS. 9 and 10, a rear cover 185 may be disposed at the rear of the drive module 130, and may be coupled to the rear bracket 130R. A rear hole 185*a* may be formed through the rear cover 185. The wall 200*b* of the stand 200 described above with reference to FIGS. 1 and 2 may be coupled to the rear bracket 130R through the rear hole 185*a*. In addition, a cable or the like may be connected to the display device 100 and the wall 200*b* of the stand 200 through the rear hole 185*a*.

A lower cover 183 may be disposed at the rear of the timing controller board TB, and may be coupled to the first bracket 181. The lower cover 183 may cover the timing controller board TB.

Meanwhile, a first side frame 153 may be adjacent to a right side of the plate 120, and may be coupled to a rear surface of the plate 120. A first wing 143 may be coupled to the first side frame 153 through a sliding mount 152, and may be pivotably connected to the first wing bracket 131.

Meanwhile, a second side frame 151 may be adjacent to a left side of the plate 120, and may be coupled to the rear surface of the plate 120. A second wing 141 may be coupled to the second side frame 151 through a sliding mount 152, and may be pivotably connected to the second wing bracket 132.

Referring to FIG. 11, the plate 120 may be flexible. For example, the plate 120 may be a metal plate. The plate 120 may be referred to as a flexible plate 120, a frame 120, or a module cover 120. The display panel 110 may be positioned in front or on the front surface of the plate 120. The display panel 110 may be flexible. For example, the display panel 110 may be an OLED panel. The inner plate 160 and the frame 170 described above may be flexible (see FIG. 5). For example, the inner plate 160 may be a metal plate.

The display panel 110 may define the front surface of the display device 100, and may display an image. The display panel 110 may include a plurality of pixels to output an image in accordance with color, brightness, and chroma of each pixel. The display panel 110 may generate light corresponding to red, green, or blue color in response to a control signal.

The display device 100 may have a variable curvature. The left and right sides of the display device 100 may be configured to move forward. For example, when an image is viewed from the front of the display device 100, the display device 100 may be curved concavely. In this case, the plate 120 may be curved with the same curvature as the display panel 110. Alternatively, the display panel 110 may be curved corresponding to the curvature of the plate 120.

Referring to FIGS. 12 and 13, the plate 120 may have a shape corresponding to the display panel 110, and may be coupled to the rear of the display panel 110.

The drive module 130 may be coupled to the rear of the plate 120. The drive module 130 may include a front bracket 130F, a base 130B, and wing brackets 131 and 132.

The front bracket 130F may be coupled or fixed to the rear or the rear surface of the plate 120. The front bracket 130F may be in the shape of a rectangular flat plate. The base 130B may be coupled or fixed to the front bracket 130F, and may define a bottom of the drive module 130.

There may be a plurality of wing brackets 131 and 132. The plurality of wing brackets 131 and 132 may include a first wing bracket 131 and a second wing bracket 132. The first wing bracket 131 may be coupled or fixed to the front bracket 130F, and may be disposed opposite the second wing bracket 132. The second wing bracket 132 may also be coupled or fixed to the front bracket 130F.

The wing bracket 131, 132 may have a V-shape. The wing bracket 131, 132 may be a pair of brackets 131, 132. An upper bracket 131*a*, 132*a* of the wing bracket 131, 132 may be positioned in parallel with a lower bracket 131*b*, 132*b* thereof. A pin (see 'pin P' in FIG. 17) may be disposed between the upper bracket 131*a*, 132*a* and the lower bracket 131*b*, 132*b*. The pin may connect vertices of the upper bracket 131*a*, 132*a* and the lower bracket 131*b*, 132*b*.

The first wing 143 may be pivotably connected to the first wing bracket 131. The second wing 141 may be pivotably connected to the second wing bracket 132. The first wing 143 and the second wing 141 may be line-symmetric with respect to the drive module 130. The descriptions of the first wing 143 and the first wing bracket 131 may be equally applied to the second wing 141 and the second wing bracket 132 (and vice versa). The first wing 143 may include a wing plate 1431, a pivot shaft PH, and a lever 1435.

The wing plate 1411, 1431 may be an elongated plate. The lever 1415, 1435 may extend from one end of the wing plate 1411, 1431. The lever 1415, 1435 may be an elongated plate. A length of the lever 1415, 1435 may be less than a length of the wing plate 1411, 1431, and a width of the lever 1415, 1435 may be less than a width of the wing plate 1411, 1431. A thickness of the wing plate 1411, 1431 may be substantially equal to a thickness of the lever 1415, 1435.

The pivot shaft PH may be pivotably connected to the pin of the wing bracket 131, 132. The pin may be inserted into the pivot shaft PH of the wing 141, 143. The wing 141, 143 may pivot on the wing bracket 131, 132 about the pin.

Referring to FIGS. 13 and 14, the lead screw 133 may be rotatably installed on the front bracket 130F. For example, the lead screw 133 may be elongated, and may have a thread on its outer surface. The lead screw 133 may be inserted into a slider 134*a*. The slider 134*a* may be threadedly coupled to the lead screw 133. Rotation of the lead screw 133 may cause the slider 134*a* to reciprocate in a longitudinal direction of the lead screw 133.

A slider guide 134*b* may be fixed onto the slider 134*a*. The slider guide 134*b* may move together with the slider 134*a*. A guide shaft 135*a*, 135*b* may be coupled or fixed to the front bracket 130F. The guide shaft 135*a*, 135*b* may be parallel to the lead screw 134*b*. The guide shaft 135*a*, 135*b* may include a first guide shaft 135*a* and a second guide shaft 135*b*. The first guide shaft 135*a* may be disposed opposite the second guide shaft 135*b* with respect to the lead screw 133. The guide shaft 135*a*, 135*b* may be inserted into the slider guide 134*b*. Accordingly, the slider 134*a* may stably reciprocate in the longitudinal direction of the lead screw 133 by the rotation of the lead screw 133.

A motor 136 may be mounted on the base 130B. The motor 136 may be an electric motor. The motor 136 may be a step motor. The motor 136 may control the number of steps corresponding to a rotation angle, the rotational direction, and the rotational speed. A rotating shaft 136*a* of the motor 136 may intersect the longitudinal direction of the lead screw 133. The motor 136 and the rotating shaft 136*a* of the motor 136 may be disposed between the lead screw 133 and the base 130B. A worm 137*d* may be fixed to the rotating shaft 136*a* of the motor 136 so as to rotate together with the rotating shaft 136*a* of the motor 136. A worm gear 137*a* may mesh with the worm 137*d*. A transmission gear 137*b* may rotate coaxially with the worm gear 137*a*. A drive gear 137*c* may be fixed to one end of the lead screw 133 so as to rotate together with the lead screw 133. The drive gear 137*c* may mesh with the transmission gear 137*b*. A diameter of the drive gear 137*c* may be greater than a diameter of the transmission gear 137*b*.

Referring to FIG. 15, a disk indicator 136*b* may be adjacent to an end of the rotating shaft 136*a* of the motor 136, and may be fixed to the rotating shaft 136*a*. The disk indicator 136*b* may include a plurality of holes (no reference numeral) spaced apart from each other in a circumferential direction of the disk indicator 136*b*.

A counter sensor 136*c* may be adjacent to the disk indicator 136*b*, and may be fixed to the base 130B or the wing bracket 132. The counter sensor 136*c* may be a photo sensor. The counter sensor 136*c* may have a horseshoe shape. A light-emitting portion and a light-receiving portion of the counter sensor 136*c* may be spaced apart from each other while facing each other. As the rotating shaft 136*a* rotates, the disk indicator 136*b* may rotate while passing between the light-emitting portion and the light-receiving portion of the counter sensor 136*c*. In response to the rotation of the disk indicator 136*b*, light of the light-emitting portion of the counter sensor 136*c* may pass through the holes of the disk indicator 136*b* or may be blocked by the indicator 136*b*.

Accordingly, the counter sensor 136*c* may detect the number of revolutions and/or amount of rotation of the motor 136.

Amount 130M may be adjacent to an outer circumference of the drive gear 137*c*, and may be fixed to the rear bracket 130R. An extension portion 130M1, 130M2 may extend from the mount 130M in a direction parallel to the lead screw 133. The extension portion 130M1, 130M2 may be positioned above the slider 134*a* or the slider guide 134*b*.

A pin indicator 138*a* (see FIG. 14) may be fixed onto the slider 134*a* or the slider guide 134*b*. The pin indicator 138*a* may be in the shape of a pin.

A first sensor 138*b* may be coupled to the extension portion 130M1. Alternatively, the first sensor 138*b* may be coupled to the front bracket 130F. The first sensor 138*b* may be a photo sensor. The first sensor 138*b* may have a horseshoe shape. A light-emitting portion and a light-receiving portion of the first sensor 138*b* may be spaced apart from each other while facing each other. As the slider 134*a* performs a linear reciprocating motion, the pin indicator 138*a* may pass between the light-emitting portion and the light-receiving portion of the first sensor 138*b*. In response to the movement of the pin indicator 138*a*, light from the light-emitting portion of the first sensor 138*b* may be provided to the light-receiving portion of the first sensor 138*b* or may be blocked by the pin indicator 138*a*.

Accordingly, the first sensor 138*b* may detect the approach of the pin indicator 138*a*. When the slider 134*a* is located adjacent to the front bracket 130F, the first sensor 138*b* may detect the pin indicator 138*a* (see FIGS. 16 and 17). In this case, as will be described later with reference to FIGS. 18 to 20, the plate 120 and the display panel 110, which are coupled to the slider 134*a* through the wings 141 and 143 and the side frames 151 and 153, may have a minimum curvature, and this position may be referred to as a start point of the slider 134*a*. For example, the minimum curvature may be 'zero (0)', and accordingly, the display panel 110 may be flat.

A second sensor 139*b* may be spaced rearward from the first sensor 138*b*, and may be coupled to the extension portion 130M1. Alternatively, the second sensor 139*b* may be coupled to the rear bracket 130R. The second sensor 139*b* may be a photo sensor. The second sensor 139*b* may have a horseshoe shape. A light-emitting portion and a light-receiving portion of the second sensor 139*b* may be spaced apart from each other while facing each other. As the slider 134*a* performs a linear reciprocating motion, the pin indicator 138*a* may pass between the light-emitting portion and the light-receiving portion of the second sensor 139*b*. In response to the movement of the pin indicator 138*a*, light from the light-emitting portion of the second sensor 139*b* may be provided to the light-receiving portion of the second sensor 139*b* or may be blocked by the pin indicator 138*a*.

Accordingly, the second sensor 139*b* may detect the approach of the pin indicator 138*a*. When the slider 134*a* is located adjacent to the rear bracket 130R, the second sensor 139*b* may detect the pin indicator 138*a* (see FIGS. 16 and 17). In this case, as will be described later with reference to FIGS. 18 to 20, the plate 120 and the display panel 110, which are coupled to the slider 134*a* through the wings 141 and 143 and the side frames 151 and 153, may have a maximum curvature, and this position may be referred to as a terminal point of the slider 134*a*. For example, a minimum radius of curvature may be 1,000 mm, 800 mm, or 700 mm.

The display device may include at least one of the counter sensor 136*c*, the first sensor 138*b*, or the second sensor 139*b*.

Referring to FIGS. 16 and 17, the wing plate 1411 may include a first part 1411*a*, a second part 1411*b*, and a third part 1411*c*. The first part 1411*a* may be disposed opposite the lever 1415 with respect to the pivot shaft PH. The first part 1411*a* may be bent at the lever 1415, and may form an obtuse angle with respect to the lever 1415. The second part 1411*b* may be bent at the first part 1411*a*, may be substantially parallel to the lever 1415, and may form an obtuse angle with respect to the first part 1411*a*. The third part 1411*c* may be bent at the second part 1411*b*, may be substantially parallel to the first part 1411*a*, and may form an obtuse angle with respect to the second part 1411*b*.

The wing 141 may include a connecting rod 1416. The connecting rod 1416 may be fixed to or extend from lever 1415. The connecting rod 1416 may be connected to the slider 134*a*. The connecting rod 1416 may be pivotably connected to the slider 134*a*. The connecting rod 1416 may have a long hole LH. The long hole LH may be formed at an end of the connecting rod 1416 that is adjacent to the slider 134*a*. The slider 134*a* may be provided with a connecting pin GP. The connecting pin GP may have a cylindrical shape. A diameter of the connecting pin GP may be substantially equal to a width of the long hole LH.

The slider 134*a* may reciprocate in the longitudinal direction of the lead screw 133 by rotation of the lead screw 133.

The lever 1415 that is connected to the slider 134*a* by the connecting rod 1416 may move together with the slider 134*a*, and the wing 141 may pivot about the pivot shaft PH. In this case, the connecting pin GP may move within the long hole LH.

Referring to FIGS. 18 to 20, the side frames 151 and 153 (see FIG. 12) may be coupled or fixed to the rear or the rear surface of the plate 120. As fastening members, such as screws, pass through the first side frame 153 and are fastened to the plurality of side fixing parts 162P (see FIG. 8) adjacent to the right side of the plate 120, the first side frame 153 may be coupled to the plate 120. As fastening members, such as screws, pass through the second side frame 151 and are fastened to the plurality of side fixing parts 162P (see FIG. 8) adjacent to the left side of the plate 120, the second side frame 151 may be coupled to the plate 120.

The side frame 151 may include a sliding mount 152. The sliding mount 152 may be mounted on or fixed to the side frame 151.

The wing 141 may be coupled to the sliding mount 152 to be movable on the sliding mount 152. As the wing 141 moves on the sliding mount 152, an end of the wing plate 1411 may contact the sliding mount 152.

The sliding mount 152 may have a side wall 152W. The side wall 152W may face a side surface of the wing plate 1411. As the wing plate 1411 moves on the sliding mount 152, the wing plate 1411 may contact the side wall 152W. The side wall 152W may guide the movement of the wing plate 1411.

A guide slot 152S may be formed in the side wall 152W. The guide slot 152S may be formed through the side wall 152W in an elongated manner in a longitudinal direction of the wing plate 1411. For example, the guide slot 152S may be in the shape of a rectangle.

An end pin 1419 may be inserted into the guide slot 152S. The end pin 1419 may be movable on the guide slot 152S. The end pin 1419, together with the guide slot 152S, may limit the movement of the wing plate 1411. For example, the end pin 1419 may have a rectangular cross-section.

Accordingly, the force transmitted to the side frame 151 by the wing plate 1411 may be constantly maintained. In addition, the flattening of regions adjacent to both ends of the display panel 110 and the plate 120 may be reduced or avoided when the display panel 110 and the plate 120 are curved.

In response to pivoting movement of the second wing 141, the second side frame 151 may push the plate 120 forward or pull the plate 120 rearward at a position adjacent to the left side of the plate 120. In response to pivoting movement of the first wing 143, the first side frame 153 may push the plate 120 forward or pull the plate 120 rearward at a position adjacent to the right side of the plate 120. That is, the plate 120 and the display panel 110 may be curved when pushed by the side frames 151 and 153, or may be flat when pulled by the side frames 151 and 153.

Meanwhile, the sliding mount 152 may include a stopper 152*a* formed by bending its end. When the plate 120 remains in a flat state, the end of the wing plate 411 may be in contact with the stopper 152*a* of the sliding mount 152. Accordingly, the front surface of the display panel 110 may be prevented from being curved convexly due to both ends of the plate 120 being directed toward the rear of the display device 100.

Referring to FIG. 21, a third frame 173' is a modified example of the third frame 173 described with reference to FIGS. 5 and 22. The fourth frame 174 described above with reference to FIG. 5 may also be modified like the third frame 173'. The third frame 173' may include a third vertical portion 173V' and a third horizontal portion 173H1', 173H2', 173H3'. The third horizontal portion 173H1', 173H2', 173H3' may be referred to as a third rib 173H1', 173H2', 173H3'.

The third vertical portion 173V' may define a left side 170L of a frame 170'. A length of the third vertical portion 173V' may be defined in the up-and-down direction, a width of the third vertical portion 173V' may be defined in the front-and-rear direction, and a thickness of the third vertical portion 173V' may be defined in the left-and-right direction.

The third horizontal portion 173H1', 173H2', 173H3' may protrude from the inside of the third vertical portion 173V' in a direction intersecting the third vertical portion 173V'. A third rear horizontal portion 173H1' may protrude rightward from a rear end of the third vertical portion 173V' and may extend in a longitudinal direction of the third vertical portion 173V'. A third center horizontal portion 173H2' may protrude rightward between the rear end and a front end of the third vertical portion 173V', and may extend in the longitudinal direction of the third vertical portion 173V'. A third front horizontal portion 173H3' may be disposed opposite the third rear horizontal portion 173H1' with respect to the third center horizontal portion 173H2', may protrude rightward from the inside of the third vertical portion 173V', and may extend in the longitudinal direction of the third vertical portion 173V'. The third rear horizontal portion 173H1' may be referred to as a third rear rib 173H1', the third center horizontal portion 173H2' may be referred to as a third center rib 173H2', and the third front horizontal portion 173H3' may be referred to as a third front rib 173H3'.

The left side of the plate 120 may be inserted between the third rear horizontal portion 173H1' and the third center horizontal portion 173H2'.

The left side of the inner plate 160 may be inserted between the third center horizontal portion 173H2' and the third front horizontal portion 173H3'.

The display panel 110 may be disposed opposite the inner plate 160 with respect to the third front horizontal portion 173H3'. The display panel 110 may be positioned at the right side of the third vertical portion 173V'.

Meanwhile, an upper end of the third rear horizontal portion 173H1' may be positioned in alignment with an upper end of the third vertical portion 173V', and an upper end of the third center horizontal portion 173H2' and an upper end of the third front horizontal portion 173H3' may be spaced downward from the upper end of the third vertical portion 173V'.

Referring to FIGS. 22 and 23, the third frame 173 may include a third vertical portion 173V and a third horizontal portion 173H1, 173H2, 173H3. The description of the third frame 173 may be equally applied to the fourth frame 174 (see FIG. 5). The third horizontal portion 173H1, 173H2, 173H3 may be referred to as a third rib 173H1, 173H2, 173H3.

The third vertical portion 173V may define a left side 170L of the frame 170. A length of the third vertical portion 173V may be defined in the up-and-down direction, a width of the third vertical portion 173V may be defined in the front-and-rear direction, and a thickness of the third vertical portion 173V may be defined in the left-and-right direction.

The third horizontal portion 173H1, 173H2, 173H3 may protrude from the inside of the third vertical portion 173V in a direction intersecting the third vertical portion 173V. An upper end of the third horizontal portion 173H1, 173H2, 173H3 may be positioned downward relative to an upper end of the third vertical portion 173V. A third rear horizontal portion 173H1 may protrude rightward from a rear end of the third vertical portion 173V and may extend in a longitudinal direction of the third vertical portion 173V. A third center horizontal portion 173H2 may protrude rightward between the rear end and a front end of the third vertical portion 173V, and may extend in the longitudinal direction of the third vertical portion 173V. A third front horizontal portion 173H3 may be disposed opposite the third rear horizontal portion 173H1 with respect to the third center horizontal portion 173H2, may protrude rightward from the inside of the third vertical portion 173V, and may extend in the longitudinal direction of the third vertical portion 173V. The third rear horizontal portion 173H1 may be referred to as a third rear rib 173H1, the third center horizontal portion 173H2 may be referred to as a third center rib 173H2, and the third front horizontal portion 173H3 may be referred to as a third front rib 173H3.

The left side of the plate 120 may be inserted between the third rear horizontal portion 173H1 and the third center horizontal portion 173H2.

The left side of the inner plate 160 may be inserted between the third center horizontal portion 173H2 and the third front horizontal portion 173H3.

The display panel 110 may be disposed opposite the inner plate 160 with respect to the third front horizontal portion 173H3. The display panel 110 may be positioned at the right side of the third vertical portion 173V.

A third adhesive member GP3 may be disposed between the third front horizontal portion 173H3 and the display panel 110, and may be coupled to the third front horizontal portion 173H3 and the display panel 110. Accordingly, the third frame 173 may be coupled to the display panel 110. Likewise, the fourth frame 174 (see FIG. 4) may be coupled to the display panel 110. For example, the third adhesive member GP3 may be a double-sided tape.

In this case, when the side frames 151 and 153 (see FIG. 10) push the plate 120 forward, the display panel 110 may be curved with a greater curvature than the inner plate 160 and the first and second frames 171 and 172 fixed to the inner plate 160, and the third and fourth frames 173 and 174 may slip with respect to the inner plate 160. In other words, in response to the bending of the display device, the third frame 173 may be away from left ends of the first and second frames 171 and 172, and the fourth frame 174 may be away from right ends of the first and second frames 171 and 172.

Meanwhile, the upper end of the third horizontal portion 173H1, 173H2, 173H3 may be spaced downward from the upper end of the third vertical portion 173V.

Meanwhile, a gap cover 175 may be disposed on the third center horizontal portion 173H2 and the third front horizontal portion 173H3. A first leg 1751 may protrude upward from the third center horizontal portion 173H2. A second leg 1752 may protrude upward from the third front horizontal portion 173H3. A cover portion 1753 may be disposed on the first leg 1751 and the second leg 1752. The cover portion 1753 may be spaced downward from the upper end of the third vertical portion 173V, and may be formed flat.

Referring to FIGS. 24 and 25, the first frame 171 may include a first vertical portion 171V and a first horizontal portion 171H1, 171H2. The description of the first frame 171 may be equally applied to the second frame 172 (see FIG. 4). The first horizontal portion 171H1, 171H2 may be referred to as a first rib 171H1, 171H2.

The first vertical portion 171V may define an upper side 170U of the frame 170. A length of the first vertical portion 171V may be defined in the left-and-right direction, a width of the first vertical portion 171V may be defined in the front-and-rear direction, and a thickness of the first vertical portion 171V may be defined in the up-and-down direction.

The first horizontal portion 171H1, 171H2 may protrude from the inside of the first vertical portion 171V in a direction intersecting the first vertical portion 171V. A first rear horizontal portion 171H1 may protrude downward from a rear end of the first vertical portion 171V and may extend in a longitudinal direction of the first vertical portion 171V. A first center horizontal portion 171H2 may protrude downward between the rear end and a front end of the first vertical portion 171V, and may extend in the longitudinal direction of the first vertical portion 171V. The first rear horizontal portion 171H1 may be referred to as a first rear rib 171H1, and the first center horizontal portion 171H2 may be referred to as a first center rib 171H2.

The upper side of the plate 120 may be inserted between the first rear horizontal portion 171H1 and the first center horizontal portion 171H2.

The inner plate 160 may be disposed opposite the plate 120 with respect to the first center horizontal portion 171H2. In addition, a plurality of coupling portions 160K may be bent rearward from the upper side of the inner plate 160, may be spaced apart from each other along the upper side of the inner plate 160, and may be inserted into a coupling groove 171*g* formed in a front surface of the first center horizontal portion 171H2. Here, the coupling groove 171*g* may be adjacent to the first vertical portion 171V and may extend along a longitudinal direction of the first center horizontal portion 171H2. Accordingly, the coupling between the inner plate 160 and the first frame 171 may be securely maintained.

A first adhesive member GP1 may be disposed between the first center horizontal portion 171H2 and the inner plate 160, and may be coupled to the first center horizontal portion 171H2 and the inner plate 160. Accordingly, the first frame 171 may be coupled to the inner plate 160. For example, the first adhesive member GP1 may be a double-sided tape.

Meanwhile, in a width direction of the first vertical portion 171V, the first center horizontal portion 171H2 may be positioned at approximately a middle of the first vertical portion 171V, and may protrude further than the first rear horizontal portion 171H1. A bending center line 171Vc of the first vertical portion 171V may be located to correspond to the first center horizontal portion 171H2.

Referring to FIG. 26, the second frame 172 may include a second vertical portion 172V and a second horizontal portion 172H1, 172H2.

The second vertical portion 172V may define a lower side 170D of the frame 170. A length of the second vertical portion 172V may be defined in the left-and-right direction, a width of the second vertical portion 172V may be defined in the front-and-rear direction, and a thickness of the second vertical portion 172V may be defined in the up-and-down direction.

The second horizontal portion 172H1, 172H2 may protrude from the inside of the second vertical portion 172V in a direction intersecting the second vertical portion 172V. A second rear horizontal portion 172H1 may protrude upward from a rear end of the second vertical portion 172V and may extend in a longitudinal direction of the second vertical portion 172V. A second center horizontal portion 172H2 may protrude upward between the rear end and a front end of the second vertical portion 172V, and may extend in the longitudinal direction of the second vertical portion 121V. The second rear horizontal portion 172H1 may be referred to as a second rear rib 172H10, and the second center horizontal portion 172H2 may be referred to as a second center rib 172H2.

The lower side of the plate 120 may be inserted between the second rear horizontal portion 172H1 and the second center horizontal portion 172H2.

The inner plate 160 may be disposed opposite the plate 120 with respect to the second center horizontal portion 172H2.

A second adhesive member GP2 may be disposed between the second center horizontal portion 172H2 and the inner plate 160, and may be coupled to the second center horizontal portion 172H2 and the inner plate 160. Accordingly, the second frame 172 may be coupled to the inner plate 160. For example, the second adhesive member GP2 may be a double-sided tape.

Meanwhile, in a width direction of the second vertical portion 172V, the second center horizontal portion 172H2 may be positioned at approximately a middle of the second vertical portion 172V, and may protrude further than the second rear horizontal portion 172H1. A bending center line 172Vc of the second vertical portion 172V may be located to correspond to the first center horizontal portion 171H2.

Meanwhile, a pressed part 160P may be formed by being pressed rearward from a front surface of the inner plate 160, and may be disposed at the rear of an electronic component such as the source PCB 112. In this case, at least one slit (not shown) may be formed through the pressed part 160P in a thickness direction of the pressed part 160P, and may be elongated vertically. Accordingly, the pressed part 160P may minimize an increase in gap between the display panel 110 and the inner plate 160 due to the source PCB 112, and the slit may improve flexible characteristics of the inner plate 160 at the position of the pressed part 160P. For example, an air gap of approximately 0.9 mm may be formed between the display panel 110 and the inner plate 160.

Referring to FIG. 27, the first vertical portion 171V may be divided into a first portion 171Va at the front of the bending center line 171Vc and a second portion 171Vb at the rear of the bending center line 171Vc. When the first vertical portion 171V is bent, with respect to the bending center line 171Vc, the second portion 171Vb may be stretched by alpha ($\alpha$), and the first portion 171Va may be compressed by beta ($\beta$).

Referring to FIG. 28, the frame 170 may contain a resin material. For example, the frame 170 may include an acrylonitrile butadiene styrene (ABS) material. In this case, the frame 170 may be elastically restored in a section in which strain (%) is 0.5% or less.

Referring to FIG. 29, when the frame 170 has a thickness of 1.0 mm, allowable stress depending on the width (L) of the frame 170 may be examined. Here, the width (L) of the frame 170 may be defined in the front-and-rear direction.

When the radius of curvature of the frame 170 in the width direction of the frame 170 is 1,000 mm, a stress ($\sigma$) of 10.9 MPa may be applied to the frame 170 with a width L of 7.0 mm, and the frame 170, which exhibits a strain ($\varepsilon$) of 0.0035, may be in the elastic recovery region. When the radius of curvature of the frame 170 in the width direction of the frame 170 is 700 mm, a stress ($\sigma$) of 15.5 MPa may be applied to the frame 170 with a width L of 7.0 mm, and the frame 170, which exhibits a strain ($\varepsilon$) of 0.005, may be in the elastic recovery region. Here, the strain ($\varepsilon$) may be the ratio of a deformation length ($\alpha$ or $\beta$ in FIG. 27) of the frame 170 to the width L.

The first frame 171 and the second frame 172 may be bent and elastically deformed together with the inner plate 160 described above. Here, elastic deformation may refer to deformation within the elastic limit. That is, the first frame 171 and the second frame 172 may be restored to a state before elastic deformation when the force applied to the first frame 171 and the second frame 172 is released. For example, the first frame 171 and the second frame 172 may each have a width of 7.0 mm or less (see FIG. 5). In addition, the first frame 171, the second frame 172, the third frame 173, and the fourth frame 174 may have the same width.

Referring to FIGS. 1 to 29, a display device according to an aspect of the present disclosure may include: a flexible display panel; a flexible inner plate disposed at a rear of the display panel and to which the display panel is coupled; and a frame covering an edge of the inner plate, the frame may include a first frame extending along a first side of the inner plate, the first frame being fixed to the inner plate such that the first frame is bent or flat along with the inner plate, the first frame may be elastically deformed when the inner plate is bent.

The frame may include a second frame extending along a second side of the inner plate that is opposite the first side of the inner plate, the second frame may be elastically deformed when the inner plate is bent.

The display panel may have a minimum radius of curvature of 700 mm, the first frame may have a width that is defined in a front-and-rear direction and less than or equal to 7.0 mm.

The first frame may include: a first vertical portion that defines the width of the first frame; and a first center horizontal portion that protrudes from an inside of the first vertical portion and extends along the first vertical portion, the first center horizontal portion being disposed at a rear of the inner plate, the display device may further include a first adhesive member that is disposed between the inner plate and the first center horizontal portion and coupled to the inner plate and the first center horizontal portion.

The inner plate may include a plurality of coupling portions bent rearward from the first side of the inner plate, the first center horizontal portion may include a coupling groove formed at a front surface of the first center horizontal portion and into which the plurality of coupling portions are inserted.

The display device may further include a flexible plate disposed at the rear of the inner plate and coupled to the inner plate, the first frame may further include a first rear horizontal portion protruding from the inside of the first vertical portion, the first rear horizontal portion being disposed opposite the inner plate with respect to the first center horizontal portion, the plate may be inserted between the first center horizontal portion and the first rear horizontal portion.

The frame may further include a third frame extending along a third side of the inner plate that intersects the first side of the inner plate, the first frame and the third frame may be separated at a corner between the first frame and the third frame.

The third frame may include: a third vertical portion that defines a width of the third frame; and a third front horizontal portion that protrudes from an inside of the third vertical portion and extends along the third vertical portion, the third front horizontal portion being disposed at the rear of the display panel, the display device may further include a third adhesive member that is disposed between the third front horizontal portion and the display panel and coupled to the third front horizontal portion and the display panel.

The third frame may further include a third center horizontal portion protruding from the inside of the third vertical portion and disposed at a rear of the third front horizontal portion, the inner plate may be inserted between the third center horizontal portion and the third front horizontal portion.

The display device may further include a flexible plate disposed at a rear of the inner plate and coupled to the inner plate, the third frame may further include a third rear horizontal portion protruding from the inside of the third vertical portion, the third rear horizontal portion being disposed opposite the inner plate with respect to the third center horizontal portion, the plate may be inserted between the third center horizontal portion and the third rear horizontal portion.

The first frame may include a metal, plastic or resin material.

The inner plate may include: a pressed part formed by being pressed rearward from a front surface of the inner plate; and at least one slit formed through the pressed part in a thickness direction of the pressed part, the at least one slit extending in a direction perpendicular to the first side of the inner plate.

An air gap may be formed between a rear surface of the display panel and the front surface of the inner plate.

The display device may further include: a flexible plate disposed at a rear of the inner plate and coupled to the inner plate; and a drive module disposed at a rear of the plate and configured to provide power that allows the plate, the inner plate, and the display panel to be curved or flat.

The drive module may include: a slider coupled to the plate and configured to perform a linear reciprocating motion; a motor configured to provide power to the slider; and a wing disposed at the rear of the plate and having a first end coupled to the slider and a second end coupled to the plate, the wing including a first pivot shaft adjacent to the first end.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings, and a configuration "B" described in another embodiment of the disclosure and the drawings may be combined with each other. Namely, although the combination between the configurations is not directly described, the combination is possible except in the case where it is described that the combination is impossible.

The above detailed description is to be construed in all aspects as illustrative and not restrictive. The scope of the present disclosure should be determined by reasonable interpretation of the appended claims, and all changes coming within the equivalency range of the present disclosure are intended to be embraced in the scope of the present disclosure.

The invention claimed is:

1. A display device comprising:

a flexible display panel;

a flexible inner plate positioned behind the display panel and to which the display panel is coupled; and a frame covering an edge of the inner plate, wherein the frame comprises a first frame extending along a first side of the inner plate, the first frame being fixed to the inner plate such that the first frame is bent or flat along with the inner plate, and wherein the first frame is elastically deformed when the inner plate is bent;

wherein the first frame comprises:

a first vertical portion defining a width of the first frame; and a first center horizontal portion protruding from an inside of the first vertical portion and extending along the first vertical portion, the first center horizontal portion being positioned behind the inner plate, and a first adhesive member positioned between the inner plate and the first center horizontal portion, and coupled to the inner plate and the first center horizontal portion.

2. The display device of claim 1, wherein the frame comprises a second frame extending along a second side of the inner plate which is opposite the first side of the inner plate, and wherein the second frame is elastically deformed when the inner plate is bent.

3. The display device of claim 1, wherein the display panel has a minimum radius of curvature of 700 mm, and wherein the first frame has a width which is defined in a front-and-rear direction and which is less than or equal to 7.0 mm.

4. The display device of claim 1, wherein the inner plate comprises a plurality of coupling portions bent rearward from the first side of the inner plate, and wherein the first center horizontal portion comprises a coupling groove formed at a front surface of the first center horizontal portion and into which the plurality of coupling portions are inserted.

5. The display device of claim 1, further comprising a flexible plate positioned behind the inner plate and coupled to the inner plate, wherein the first frame further comprises a first rear horizontal portion protruding from the inside of the first vertical portion, and opposite the inner plate with respect to the first center horizontal portion, and wherein the plate is inserted between the first center horizontal portion and the first rear horizontal portion.

6. The display device of claim 1, wherein the frame further comprises a third frame extending along a third side of the inner plate intersecting the first side of the inner plate, and wherein the first frame and the third frame are separated at a corner between the first frame and the third frame.

7. The display device of claim 6, wherein the third frame comprises:

a third vertical portion defining a width of the third frame; and a third front horizontal portion that protrudes from an inside of the third vertical portion and extends along the third vertical portion, the third front horizontal portion being disposed at the rear of the display panel, and wherein the display device further comprises a third adhesive member disposed between the third front horizontal portion and the display panel, the third adhesive member being coupled to the third front horizontal portion and the display panel.

8. The display device of claim 7, wherein the third frame further comprises a third center horizontal portion protruding from the inside of the third vertical portion and positioned behind the third front horizontal portion, and wherein the inner plate is inserted between the third center horizontal portion and the third front horizontal portion.

9. The display device of claim 8, further comprising a flexible plate positioned behind the inner plate and coupled to the inner plate, wherein the third frame further comprises a third rear horizontal portion protruding from the inside of the third vertical portion, and opposite the inner plate with respect to the third center horizontal portion, and wherein the plate is inserted between the third center horizontal portion and the third rear horizontal portion.

10. The display device of claim 1, wherein the first frame includes a metal, plastic or resin material.

11. The display device of claim 1, wherein the inner plate comprises:

a pressed part formed by being pressed rearward from a front surface of the inner plate; and at least one slit formed through the pressed part in a thickness direction of the pressed part, and extending in a direction perpendicular to the first side of the inner plate.

12. The display device of claim 11, wherein an air gap is formed between a rear surface of the display panel and the front surface of the inner plate.

13. The display device of claim 1, further comprising:

a flexible plate positioned behind the inner plate and coupled to the inner plate; and a drive module positioned behind the plate and providing power that allows the plate, the inner plate, and the display panel to be curved or flat.

14. The display device of claim 13, wherein the drive module comprises:

a slider coupled to the plate and performing a linear reciprocating motion;

a motor providing power to the slider; and a wing positioned behind the plate and having one end coupled to the slider and the other end coupled to the plate, the wing including a first pivot shaft adjacent to the one end.

* * * * *